(12) United States Patent
Oh et al.

(10) Patent No.: US 11,211,328 B2
(45) Date of Patent: Dec. 28, 2021

(54) SEMICONDUCTOR MEMORY DEVICE OF THREE-DIMENSIONAL STRUCTURE

(71) Applicant: SK hynix Inc., Gyeonggi-do (KR)

(72) Inventors: Sung-Lae Oh, Chungcheongbuk-do (KR); Dong-Hyuk Kim, Seoul (KR); Soo-Nam Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/747,171

(22) Filed: Jan. 20, 2020

(65) Prior Publication Data

US 2020/0152573 A1 May 14, 2020

Related U.S. Application Data

(63) Continuation-in-part of application No. 15/915,136, filed on Mar. 8, 2018, now Pat. No. 10,573,659.

(30) Foreign Application Priority Data

Oct. 16, 2017 (KR) .......................... 10-2017-0134075

(51) Int. Cl.
| | | |
|---|---|---|
| *H01L 27/11578* | (2017.01) | |
| *H01L 23/528* | (2006.01) | |
| *G11C 7/18* | (2006.01) | |
| *H01L 27/11519* | (2017.01) | |
| *H01L 27/11524* | (2017.01) | |
| *H01L 27/11556* | (2017.01) | |
| *H01L 27/11582* | (2017.01) | |
| *H01L 27/11565* | (2017.01) | |

(Continued)

(52) U.S. Cl.
CPC ............ *H01L 23/5286* (2013.01); *G11C 7/18* (2013.01); *H01L 23/5283* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC .. G11C 5/06–10; G11C 11/5621–5642; G11C 16/0408–0458; G11C 16/0483; G11C 27/005; G11C 5/14–148; H01L 27/11517–1156; H01L 2924/1438; H01L 29/42324–42336; H01L 29/788–7889; H01L 27/11551–11556

See application file for complete search history.

(56) References Cited

U.S. PATENT DOCUMENTS 9,812,464 B1 * 11/2017 Hwang ............. H01L 27/11582
10,304,852 B1 * 5/2019 Cui ........................ H01L 23/528

(Continued)

*Primary Examiner* — Jarrett J Stark
(74) *Attorney, Agent, or Firm* — IP&T Group LLP

(57) ABSTRACT

A semiconductor memory device includes a memory chip defined with a first pad on one surface thereof; and a circuit chip defined with a second pad which is coupled with the first pad, on one surface thereof bonded with the one surface of the memory chip. The memory chip comprising: a memory cell array; a bit line disposed in a first wiring layer between the one surface and the memory cell array, and separated into a first bit line section and a second bit line section; and a power pad disposed in a space between the first bit line section and the second bit line section in the first wiring layer, and coupled with the first pad.

21 Claims, 15 Drawing Sheets

(51) Int. Cl.
    *H01L 27/1157*     (2017.01)
    *H01L 27/11573*     (2017.01)
    *H01L 27/11529*     (2017.01)

(56) References Cited

U.S. PATENT DOCUMENTS

| | | | | |
|---|---|---|---|---|
| 10,319,635 B2* | 6/2019 | Nosho | | H01L 27/11582 |
| 10,354,980 B1* | 7/2019 | Mushiga | | H01L 27/11575 |
| 10,354,987 B1* | 7/2019 | Mushiga | | H01L 21/76898 |
| 10,797,028 B2* | 10/2020 | Liu | | H01L 27/11575 |
| 10,930,661 B2* | 2/2021 | Chen | | H01L 27/11582 |
| 10,985,142 B2* | 4/2021 | Xiao | | H01L 23/481 |
| 11,011,209 B2* | 5/2021 | Kim | | H01L 27/11556 |
| 2014/0231954 A1* | 8/2014 | Lue | | H01L 27/11524 |
| | | | | 257/528 |
| 2016/0079164 A1* | 3/2016 | Fukuzumi | | H01L 21/76898 |
| | | | | 257/324 |
| 2016/0093591 A1* | 3/2016 | Lan | | H01L 21/6835 |
| | | | | 257/506 |
| 2016/0118399 A1* | 4/2016 | Son | | H01L 27/11526 |
| | | | | 365/185.18 |
| 2016/0307910 A1* | 10/2016 | Son | | H01L 27/11573 |
| 2017/0012052 A1* | 1/2017 | Jang | | H01L 27/11565 |
| 2017/0047343 A1* | 2/2017 | Lee | | H01L 27/11529 |
| 2017/0084696 A1* | 3/2017 | Lee | | H01L 27/11565 |
| 2017/0179154 A1* | 6/2017 | Furihata | | H01L 21/76802 |
| 2017/0358593 A1* | 12/2017 | Yu | | H01L 27/11582 |
| 2018/0040553 A1* | 2/2018 | Tak | | H01L 27/1157 |
| 2018/0151587 A1* | 5/2018 | Son | | H01L 27/2454 |
| 2019/0067316 A1* | 2/2019 | Oh | | H01L 27/11568 |
| 2019/0164991 A1* | 5/2019 | Lim | | G11C 16/0483 |
| 2019/0273090 A1* | 9/2019 | Fukuzumi | | H01L 27/11575 |
| 2020/0152573 A1* | 5/2020 | Oh | | H01L 23/5286 |
| 2020/0286842 A1* | 9/2020 | Sanuki | | H01L 24/09 |
| 2020/0295037 A1* | 9/2020 | Iijima | | H01L 23/481 |
| 2020/0328186 A1* | 10/2020 | Liu | | H01L 24/83 |
| 2020/0395341 A1* | 12/2020 | Maejima | | H01L 25/0657 |
| 2021/0159110 A1* | 5/2021 | Or-Bach | | H01L 21/76254 |

* cited by examiner

SEMICONDUCTOR MEMORY DEVICE OF THREE-DIMENSIONAL STRUCTURE

CROSS-REFERENCE TO RELATED APPLICATION

This application is a continuation-in-part of U.S. application Ser. No. 15/915,136 flied on Mar. 8, 2018, which claims priority under 35 USC § 119 to Korean Patent Application No. 10-2017-0134075 filed on Oct. 16, 2017, in the Korean Intellectual Property Office, the disclosures of which are incorporated herein in their entirety by reference.

BACKGROUND

1. Technical Field

Various embodiments generally relate to a semiconductor memory device, and, more particularly, to a semiconductor memory device including a memory cell array of a three-dimensional structure.

2. Related Art

A semiconductor memory device employs various operating voltages, such as a power supply voltage, a ground voltage and a source voltage, to access data. In order to ensure the reliability of the semiconductor memory device, the operating voltages should be stably provided to the semiconductor memory device.

SUMMARY

In an embodiment, a semiconductor memory device may include: a memory chip defined with a first pad on one surface thereof; and a circuit chip defined with a second pad which is coupled with the first pad, on one surface thereof bonded with the one surface of the memory chip. The memory chip comprising: a memory cell array; a bit line disposed in a first wiring layer between the one surface and the memory cell array, and separated into a first bit line section and a second bit line section; and a power pad disposed in a space between the first bit line section and the second bit line section in the first wiring layer, and coupled with the first pad.

In an embodiment, a semiconductor memory device may include: a memory chip defined with a plurality of first pads on one surface thereof; and a circuit chip defined with a plurality of second pads which are coupled with the plurality of first pads, on one surface thereof bonded with the one surface of the memory chip. The memory chip comprising: a memory cell array including a plurality of memory blocks and a plurality of dummy blocks; a plurality of bit lines disposed in a first wiring layer between the one surface and the memory cell array, and each cut over a corresponding dummy block; and a plurality of power pads disposed in spaces in the first wiring layer, respectively, which are provided by cut bit lines, and coupled with the first pads, respectively.

In an embodiment, a semiconductor memory device may include: a first pad defined on one surface; an external coupling pad defined on the other surface which faces away from the one surface; a memory cell array disposed between the one surface and the other surface, and including a memory block and a dummy block; a bit line disposed in a first wiring layer between the memory cell array and the one surface, and separated into a first bit line section and a second bit line section by being cut over the dummy block; a power pad disposed in a space in the first wiring layer, which is provided by the cut bit line, and coupled with the first pad; and a power coupling contact passing through the dummy block, and coupling the power pad and the external coupling pad.

DETAILED DESCRIPTION

Hereinafter, a semiconductor memory device of a three-dimensional structure will be described below with reference to the accompanying drawings through various examples of embodiments.

Figure 1:
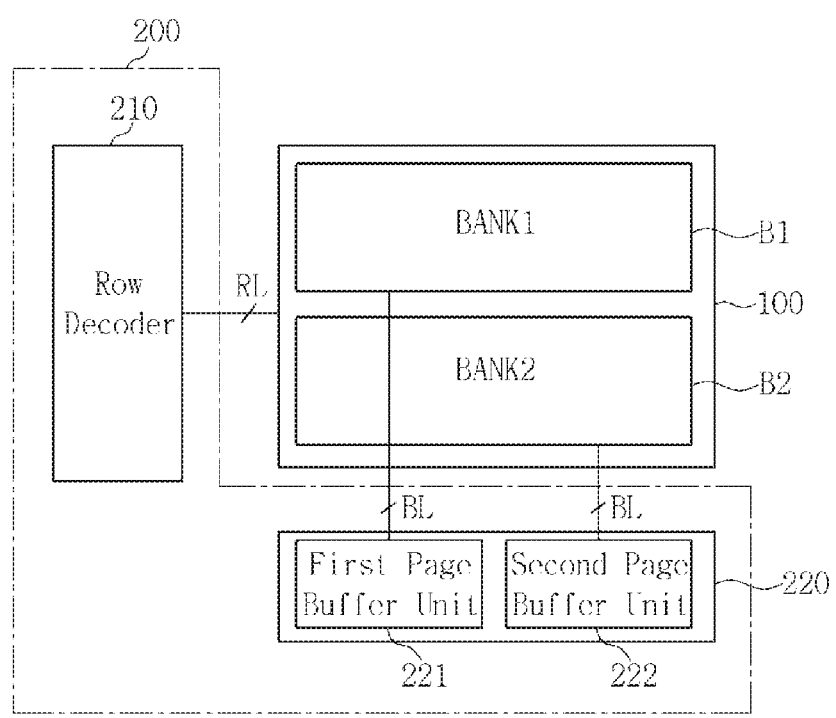
FIG. 1 is a block diagram illustrating a representation of an example of a semiconductor memory device in accordance with an embodiment.

FIG. 1 is a block diagram illustrating a representation of an example of a semiconductor memory device in accordance with an embodiment.

Referring to FIG. 1, the semiconductor memory device in accordance with the embodiment may include a memory cell array 100 and a peripheral circuit 200. The peripheral circuit 200 may include a row decoder 210 and a page buffer circuit 220. While not shown, the peripheral circuit 200 may further include a control logic, a voltage generator, a column decoder and an input/output buffer.

According to an implementation of the embodiment shown in FIG. 1, the memory cell array 100 may include a first memory bank B1 and a second memory bank B2. The memory cell array 100 including the first and second memory banks B1 and B2 may configure one plane. However, it is noted that the invention is not limited in this way and two or more memory banks may be employed.

Each of the first and second memory banks B1 and B2 may include a plurality of memory blocks (not shown). Each of the memory blocks may be coupled to the row decoder 210 through row lines RL. The row lines RL may include at least one drain select line, a plurality of word lines and at least one source select line. The memory blocks may be coupled to the page buffer circuit 220 through bit lines BL.

Each of the memory blocks may include a plurality of cell strings. Each of the cell strings may include a drain select transistor, a plurality of memory cells and a source select transistor which are coupled in series between a corresponding bit line and a common source line. In an embodiment, the memory cells may be nonvolatile memory cells.

The row decoder 210 may transmit an operating voltage generated in the voltage generator, to memory cells selected according to a row address inputted from an exterior device. The exterior device may for example be a host device operatively coupled with the memory device.

The page buffer circuit 220 may be coupled to the memory cell array 100 through bit lines BL. In an embodiment, the page buffer circuit 220 may include a first page buffer unit 221 corresponding to the first memory bank B1 and a second page buffer unit 222 corresponding to the second memory bank B2. Each of the first page buffer unit 221 and the second page buffer unit 222 may include a plurality of page buffers. The page buffers may correspond to the bit lines BL, respectively. Each of the page buffers may be coupled to the memory cell array 100 through a corresponding bit line BL. The page buffers may temporarily store data to be stored in memory cells or sense the data stored in memory cells, depending on an operation mode. The page buffers may operate as a write driver in a program operation mode, and as a sense amplifier in a read operation mode.

The control logic may output a row address in an address received through the input/output buffer, to the row decoder 210, and output a column address to the column decoder. The control logic may control the page buffer circuit 220 and the voltage generator to access selected memory cells, in response to a command received through the input/output buffer.

The voltage generator may generate various voltages required in the memory device using the external voltage. For example, the voltage generator may generate a program voltage, a pass voltage, a select read voltage and an unselect read voltage.

The column decoder may input program data to the page buffer circuit 220 in response to a column address from the control logic.

Figure 2:
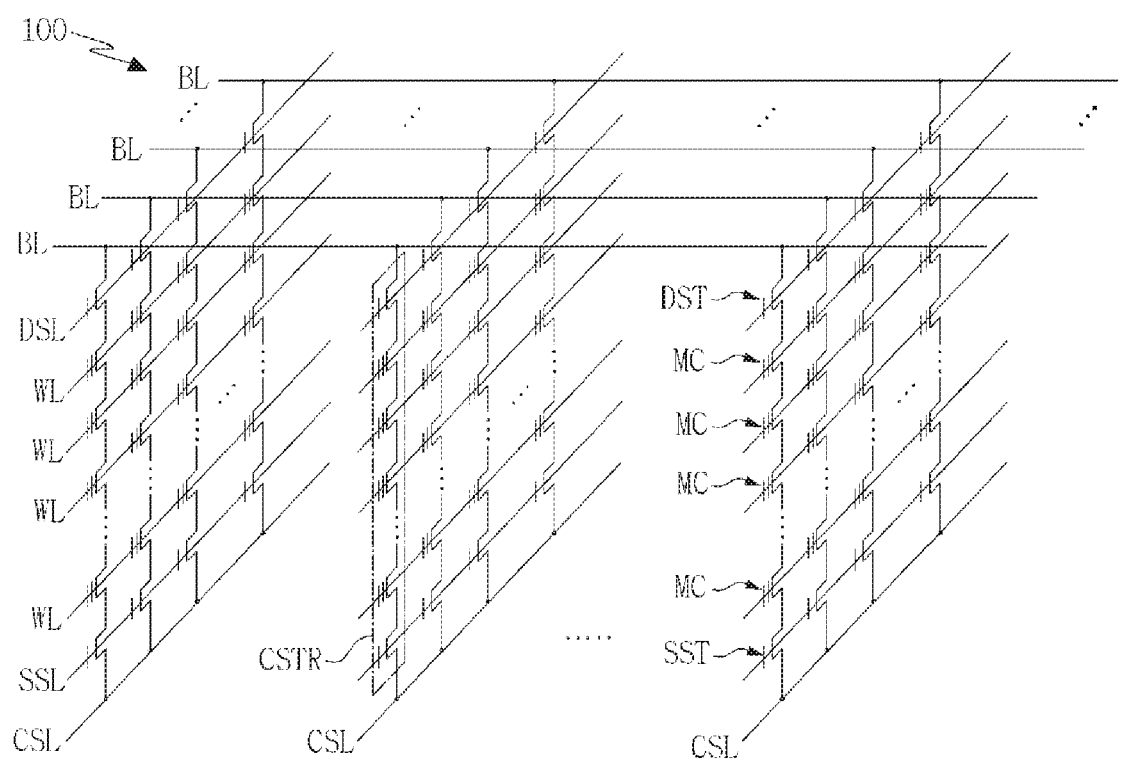
FIG. 2 is an equivalent circuit diagram illustrating a representation of an example of the memory cell array shown in FIG. 1.

FIG. 2 is an equivalent circuit diagram illustrating a representation of an example of the memory cell array shown in FIG. 1.

Referring to FIG. 2, the memory cell array 100 may include a plurality of cell strings CSTR which are coupled between a plurality of bit lines BL and a plurality of common source lines CSL.

A plurality of cell strings CSTR may be coupled in parallel to each of the bit lines BL. Each of the cell strings CSTR may include a drain select transistor DST, a plurality of memory cells MC and a source select transistor SST which are coupled in series between a corresponding bit line BL and a corresponding common source line CSL.

Source select lines SSL, a plurality of word lines WL and drain select lines DSL may be provided between the common source lines CSL and the bit lines BL. The gate terminal of the source select transistor SST may be coupled to a corresponding source select line SSL. The gate terminals of the memory cells MC may be coupled to corresponding word lines WL, respectively. The gate terminal of the drain select transistor DST may be coupled to a corresponding drain select line DSL.

The source terminal of the source select transistor SST may be coupled to a corresponding common source line CSL. The drain terminal of the source select transistor SST may be coupled to a lowermost memory cell MC. Meanwhile, the source terminal of the drain select transistor DST may be coupled to the drain terminal of an uppermost memory cell MC. The drain terminal of the drain select transistor DST may be coupled to a corresponding bit line BL.

While FIG. 2 illustrates a structure in which one drain select transistor DST and one source select transistor SST are included in each cell string CSTR, it is to be noted that the embodiment is not limited thereto and each cell string CSTR may include a plurality of drain select transistors DST or/and a plurality of source select transistors SST.

If a signal is applied to the gate terminal of the drain select transistor DST through the drain select line DSL, a signal applied through the bit line BL is transferred to the memory cells MC which are coupled in series, by which a data read or write operation may be performed. If a signal is applied to the gate terminal of the source select transistor SST through the source select line SSL, an erase operation of removing all the data stored in the memory cells MC may be performed.

Hereinbelow, in the accompanying drawings, a direction vertically projecting from the top surface of a substrate is defined as a first direction FD, and two directions parallel to the top surface of the substrate and intersecting with each other are defined as a second direction SD and a third direction TD, respectively. The second direction SD may correspond to the extending direction of bit lines, and the third direction TD may correspond to the extending direction of the row lines. The second direction SD and the third direction TD may intersect substantially perpendicularly with each other. In the drawings, a direction indicated by an arrow and a direction opposite thereto represent the same direction.

Figure 3:
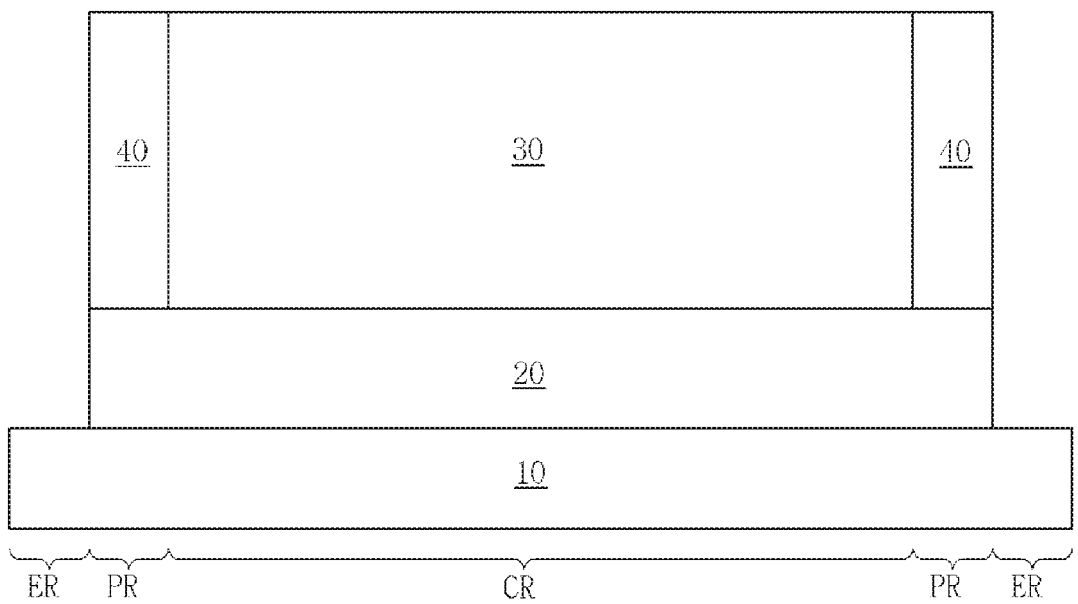
FIG. 3 is a cross-sectional view schematically illustrating a representation of an example of the layout of a semiconductor memory device in accordance with an embodiment.

FIG. 3 is a cross-sectional view schematically illustrating a representation of an example of the layout of a semiconductor memory device in accordance with an embodiment.

Referring to FIG. 3, a logic structure 20 may be disposed on a substrate 10, and a memory structure 30 may be disposed on the logic structure 20. The logic structure 20 may include the peripheral circuit 200 of FIG. 1. The memory structure 30 may include the memory cell array 100 of FIG. 1. The semiconductor memory device in accordance with the embodiment may have a PUC (peri under cell) structure.

The substrate 10 may include a circuit region CR, coupling regions PR and edge regions ER. The coupling regions PR may be disposed adjacent to both ends of the circuit region CR in the second direction SD. The edge regions ER may be disposed in the peripheries of the substrate 10 and adjacent to the coupling regions PR in the second direction SD.

The logic structure 20 and the memory structure 30 may be stacked on the substrate 10 in the circuit region CR. The logic structure 20 may also extend to the coupling regions PR. For example, one part of peripheral circuit elements configuring the logic structure 20 may be disposed in the circuit region CR, and another part may be disposed in the coupling regions PR.

Coupling structures 40 may be disposed on the memory structure 20 which is disposed in the coupling regions PR. According to another embodiment, unlike the illustration of FIG. 3, a coupling structure 40 may be disposed in the circuit region CR.

Figure 4:
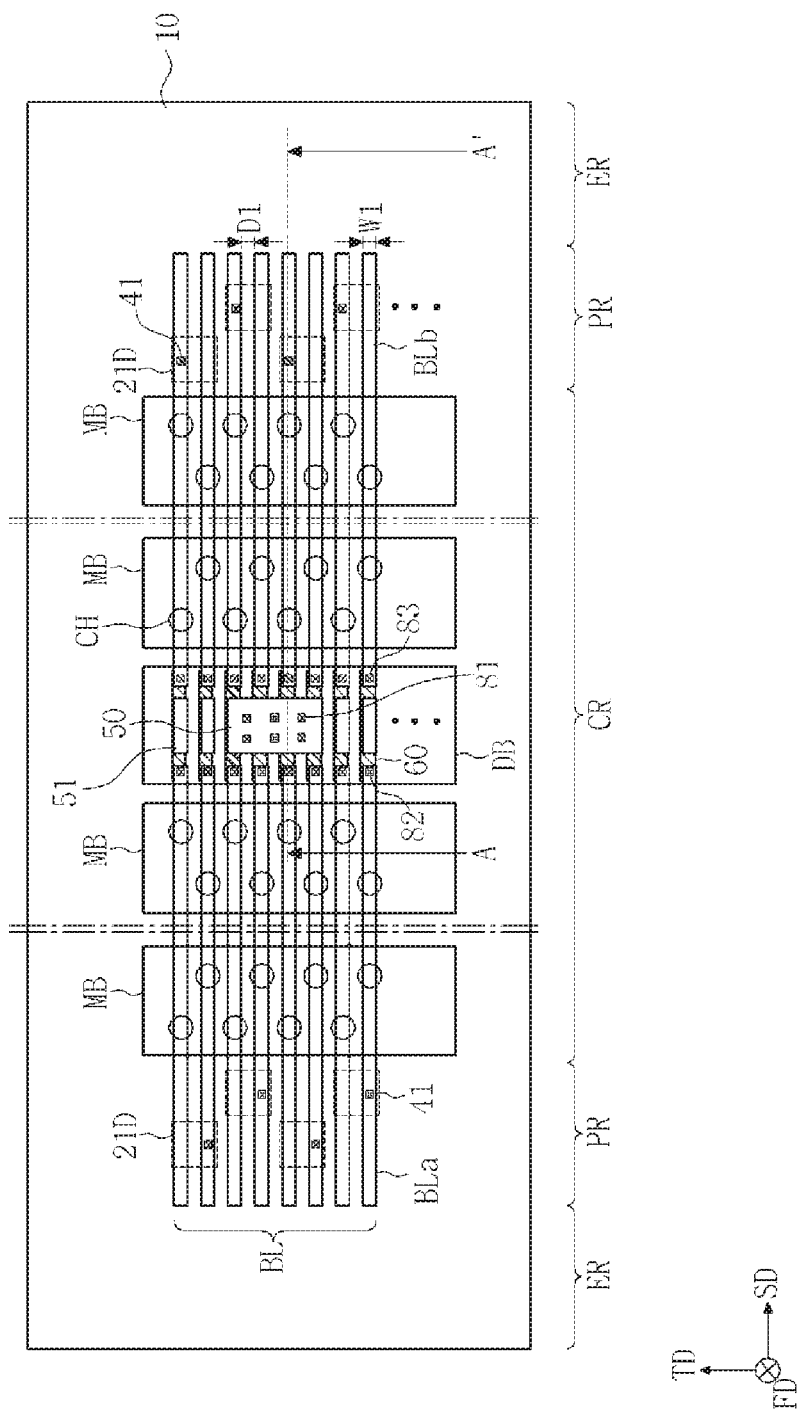
FIG. 4 is a top view illustrating a representation of an example of a semiconductor memory device in accordance with an embodiment.
Figure 5:
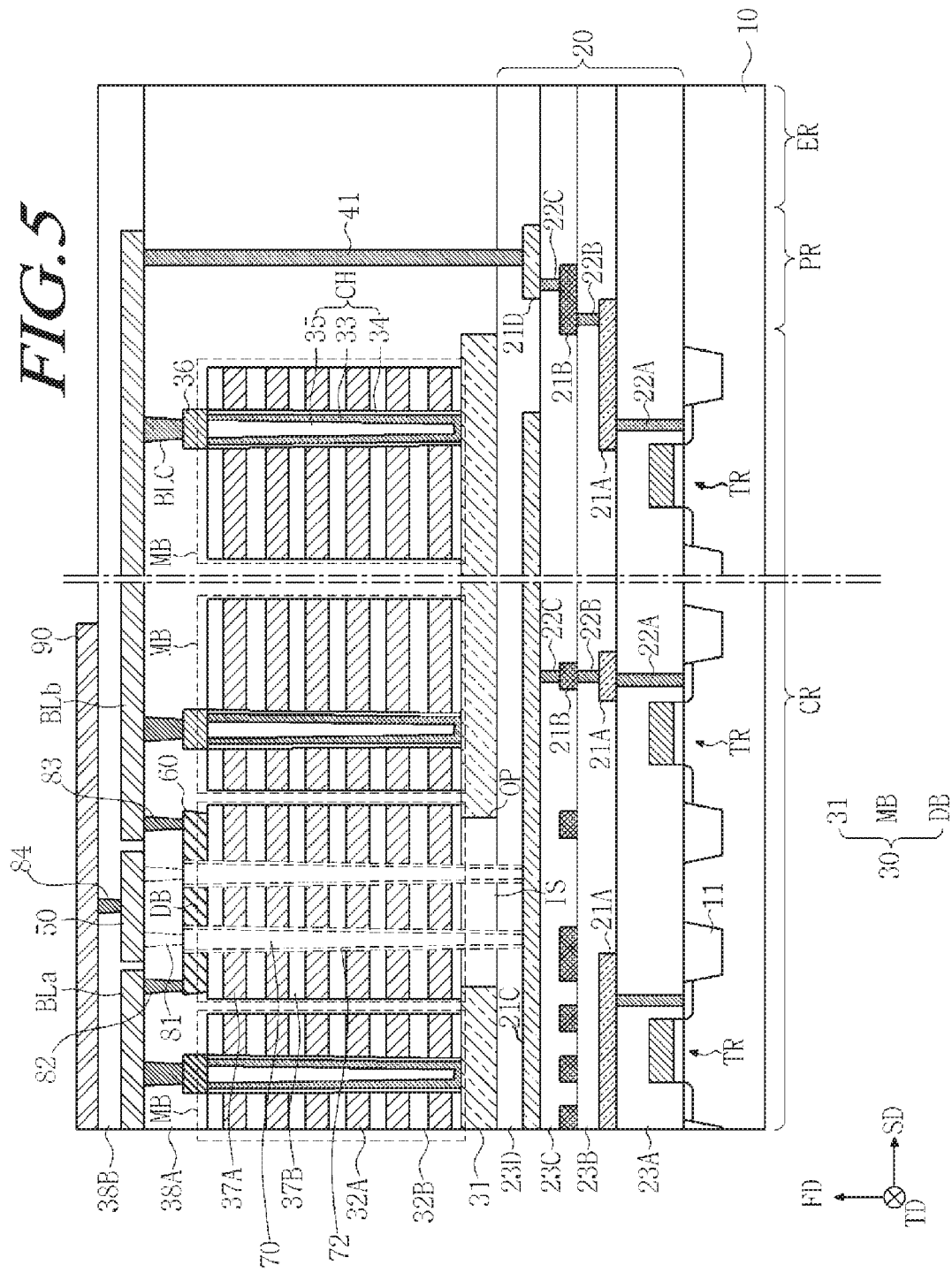
FIG. 5 is a cross-sectional view taken along the line A-A' of FIG. 4.

FIG. 4 is a top view illustrating a representation of an example of a semiconductor memory device in accordance with an embodiment, and FIG. 5 is a cross-sectional view corresponding to the line A-A' of FIG. 4.

Referring to FIGS. 4 and 5, a substrate 10 including a circuit region CR, coupling regions PR and edge regions ER may be provided. The coupling regions PR may be disposed adjacent to both ends of the circuit region CR in the second direction SD. The edge regions ER may be disposed adjacent to the coupling regions PR in the second direction SD at the peripheries of the substrate 10.

The substrate 10 may include at least one selected from the group including a monocrystalline silicon layer, an SOI (silicon on insulator), a silicon layer formed on a silicon germanium (Site) layer, a monocrystalline silicon layer formed on a dielectric layer and a polysilicon layer formed on a dielectric layer. A logic structure 20 and a memory structure 30 may be disposed by being sequentially stacked in the circuit region CR of the substrate 10. The memory structure 30 may include a semiconductor layer 31, memory blocks MB and a dummy block DB.

The logic structure 20 may include a peripheral circuit (see 200 of FIG. 1). The peripheral circuit may include peripheral circuit elements such as logic transistors TR, resistors, capacitors and fuses. The peripheral circuit elements may be integrated in the substrate 10 of the circuit region CR.

The logic transistors TR may be disposed in the active region of the substrate 10 which is defined by an isolation layer 11. In an embodiment, the logic transistors TR may be bit line select transistors of a page buffer circuit (see 220 of FIG. 1). In another embodiment, the logic transistors TR may be power transfer transistors.

The logic structure 20 may include coupling pads 21D which are electrically coupled with the logic transistors TR configuring the bit line select transistors. The coupling pads 21D may be disposed in the coupling regions PR. The logic structure 20 may include bottom wiring lines 21A, 21B and 21C and bottom contacts 22A, 22B and 22C which are electrically coupled with the logic transistors TR, and bottom dielectric layers 23A, 23B, 23C and 23D which cover the bottom wiring lines 21A, 21B and 21C, the bottom contacts 22A, 22B and 22C and the coupling pads 21D. More specifically, the bottom dielectric layer 23A covers side surfaces of the bottom contacts 22A, the bottom dielectric layer 23B covers top surfaces and side surfaces of the bottom wiring lines 21A and side surfaces of the bottom contacts 22B, the bottom dielectric layer 23C covers top surfaces and side surfaces of the bottom wiring lines 21B and side surfaces of the bottom contacts 22C, and the bottom dielectric layer 23D covers top surfaces and side surfaces of the bottom wiring lines 21C and top surfaces and side surfaces of the coupling pads 21D. The bottom contacts 22A, 22B and 22C extend in the first direction FD, while the bottom wiring lines 21A and 21C extend in the second direction SD, the bottom wiring lines 21B extend in the Third direction TD. As illustrated in FIG. 5, each of the bottom contacts 22A couples the transistor TR with the bottom wiring line 21A, each of the bottom contacts 22B couples the bottom wiring layer 21A with the bottom wiring line 21B. At least one of bottom contacts 22C couples the bottom wiring line 21B with the bottom wiring lines 21C. At least one of bottom contacts 22C couples the bottom wiring line 21B with the coupling contact 21D. The bottom dielectric layers 23A, 23B, 23C and 23D may include a silicon oxide layer, a silicon nitride layer or a silicon oxynitride layer. While the bottom dielectric layers 23A, 23B, 23C and 23D may include first to fourth bottom dielectric layers 23A, 23B, 23C and 23D, it is to be noted that the embodiment is not limited thereto.

The coupling pads 21D may be disposed on the third bottom dielectric layer 23C. The bottom wiring lines 21A, 21B and 21C may include a first bottom wiring line 21A which is disposed on the first bottom dielectric layer 23A, a second bottom wiring line 21B which is disposed on the second bottom dielectric layer 23B and a third bottom wiring line 21C which is disposed on the third bottom dielectric layer 23C.

Each of the coupling pads 21D may be electrically coupled to a logic transistor TR configuring the bit line select transistor, through bottom wiring lines 21A and 21B and bottom contacts 22A, 22B and 22C.

The third bottom wiring line 21C may be disposed at the same layer as the coupling pads 21D. The third bottom wiring line 21C may be disposed in the circuit region CR, and may be electrically coupled to a logic transistor TR through the bottom wiring lines 21A and 21B and the bottom contacts 22A, 22B and 22C.

The semiconductor layer 31 may be formed on the fourth bottom dielectric layer 23D. The semiconductor layer 31 may include a monocrystalline silicon layer or a polysilicon layer. A well region (not shown) may be formed in the semiconductor layer 31. The well region may be a P-type well which is doped with a P-type impurity. The well region may be an N-type well. The well region may be realized as a P-type well and an N-type well overlapping in the first direction FD.

The semiconductor layer 31 may be disposed in the circuit region CR. The semiconductor layer 31 may not be disposed in the coupling regions PR and the edge regions ER. In other words, the semiconductor layer 31 may expose the fourth bottom dielectric layer 23D in the coupling regions PR and the edge regions ER. The memory blocks MB and the dummy block DB may be disposed on the semiconductor layer 31. The semiconductor layer 31 may have an opening OP which overlaps with the dummy block DB in the first direction FD. The opening OP may pass through the top surface and the bottom surface of the semiconductor layer 31. An isolation dielectric layer IS may be disposed in the opening OP. Hence, the dummy block DB may overlap with the isolation dielectric layer IS in the first direction FD.

The memory blocks MB and the dummy block DB may be arranged along the second direction SD and be disposed to be separated from each other by a predetermined interval.

Each of the memory blocks MB may include a plurality of channel structures CH which extend in the first direction FD from the top surface of the semiconductor layer 31, and a plurality of gate electrode layers 32A and a plurality of first interlayer dielectric layers 32B which are alternately stacked on the semiconductor layer 31 to be positioned around and along the channel structures CH.

The channel structures CH may include a channel layer 33 and a gate dielectric layer 34 which is disposed between the channel layer 33 and the gate electrode layers 32A and first interlayer dielectric layers 32B. The channel layer 33 may include a polysilicon or monocrystalline silicon, and may include a P-type impurity such as boron (B) in some regions. The channel layer 33 may have the shape of a tube in which a center region is open. A buried dielectric layer 35 may be formed in the open center region of the channel layer 33. While not shown, the channel layer 33 may have the shape of a pillar or a solid cylinder which is completely filled up to its center. In this case, the buried dielectric layer 35 may be omitted.

The gate dielectric layer 34 may have the shape of a straw or a cylinder shell which surrounds the outer wall of the channel layer 33. While not shown, the gate dielectric layer 34 may include a tunnel dielectric layer, a charge storage layer and a blocking layer which are sequentially stacked from the outer wall of the channel layer 33. The tunnel dielectric layer may include a silicon oxide, a hafnium oxide, an aluminum oxide, a zirconium oxide or a tantalum oxide. The charge storage layer may include a silicon nitride, a boron nitride, a silicon boron nitride or a polysilicon doped with an impurity. The blocking layer may include a single layer or a stack layer of a silicon oxide, a silicon nitride, a hafnium oxide, an aluminum oxide, a zirconium oxide and a tantalum oxide. In some embodiments, the gate dielectric layer 34 may have an ONO (oxide-nitride-oxide) stack structure in which an oxide layer, a nitride layer and an oxide layer are sequentially stacked.

Among the gate electrode layers 32A, at least one layer from the lowermost gate electrode layer 32A may be used as a source select line, and at least one layer from the uppermost gate electrode layer 32A may be used as a drain select line. The gate electrode layers 32A between the source select line and the drain select line may be used as word lines. Source select transistors may be formed where the source select line surrounds the channel structures CH, memory cells may be formed where the word lines surround the channel structures CH, and drain select transistors may be formed where the drain select line surrounds the channel structures CH. By the above-described structure, a plurality of cell strings each including a source select transistor, memory cells and a drain select transistor which are disposed along each of the channel structures CH may be configured.

Conductive pads 36 may be disposed on the channel structures CH, respectively. The conductive pads 36 may include a silicon material which is doped with an impurity. For example, the conductive pads 36 may include N-type silicon.

The dummy block DB may be disposed in the center portion of the circuit region CR in the second direction SD. While FIGS. 4 and 5 illustrate the case where one dummy block DB is disposed in the center portion of the circuit region CR, it is to be noted that the embodiment is not limited thereto. For example, the dummy block DB may be disposed in a periphery of the circuit region CR, or a plurality of dummy blocks may be provided along the second direction SD in the circuit region CR.

The dummy block DB may include a plurality of dummy gate electrode layers 37A and a plurality of second interlayer dielectric layers 37B which are alternately stacked along the first direction FD. The number of the dummy gate electrode layers 37A which are included in the dummy block DB may be substantially the same as the number of the gate electrode layers 32A which are included in each of the memory blocks MB. The dummy gate electrode layers 37A may be disposed at the same layers as the gate electrode layers 32A, respectively. The gate electrode layer 32A and the dummy gate electrode layer 37A which are positioned at the same layer may be formed at the same processing step. Due to this fact, the thicknesses and materials of the gate electrode layer 32A and the dummy gate electrode layer 37A positioned at the same layer may be the same with each other.

The number of the second interlayer dielectric layers 37B which are included in the dummy block DB may be substantially the same as the number of the first interlayer dielectric layers 32B which are included in each of the memory blocks MB. The second interlayer dielectric layers 37B may be disposed at the same layers as the first interlayer dielectric layers 32B, respectively. The first interlayer dielectric layer 32B and the second interlayer dielectric layer 37B which are positioned at the same layer may be generated at the same processing step. Due to this fact, the heights and materials of the first interlayer dielectric layer 32B and the second interlayer dielectric layer 37B positioned at the same layer may be the same with each other.

A first top dielectric layer 38A may be disposed on the fourth bottom dielectric layer 23D, and may cover the side surfaces and top surfaces of the semiconductor layer 31, the memory blocks MB, the dummy block DB and the conductive pads 36.

Bit lines BL may be disposed on the first top dielectric layer 38A. Bit line contacts BLC which are coupled to the conductive pads 36 through the first top dielectric layer 38A may be disposed under the bit lines BL. The bit lines BL may be electrically coupled to the channel layer 33 of the channel structures CH through the bit line contacts BLC and the conductive pads 36.

The bit lines BL may extend in the second direction SD and be arranged along the third direction TD. Channel structures CH which are disposed in a line along the second direction SD may be coupled in common to a single bit line BL. The bit lines BL may have substantially the same width and be separated from one another by substantially the same distance. For instance, each of the bit lines BL may have a first width W1, and adjacent bit lines BL may be separated by a first interval D1. The bit lines BL may have a first pitch that is defined as the sum of the first width W1 and the first interval D1.

The bit lines BL may traverse the circuit region CR and extend onto the coupling regions PR in the second direction SD. Both ends of each of the bit lines BL may be disposed in the coupling regions PR. The bit lines BL may not be disposed in the edge regions ER.

Each of the bit lines BL may be electrically coupled to the logic transistor TR configuring the bit line select transistor, through first coupling contact 41 and the coupling pad 21D in the coupling regions PR.

In the coupling regions PR, each of the coupling pads 21D may be overlap with a corresponding bit line BL in the first direction FD.

The first coupling contacts 41 may correspond to the coupling structures 40 shown in FIG. 3. The first coupling contacts 41 may be disposed in the coupling regions PR, and may pass through the first top dielectric layer 38A and the fourth bottom dielectric layer 23D. One end of each first coupling contact 41 may be brought into contact with a corresponding bit line BL, and the other end may be brought into contact with a corresponding coupling pad 21D.

In correspondence to the arrangement structure of the bit lines BL which are repeatedly arranged with a predetermined pitch along the third direction TD, the coupling pads 21D may be repeatedly arranged with a preselected pitch along the third direction TD in the coupling regions PR. In an embodiment, as illustrated in FIG. 4, the coupling pads 21D may be arranged in a zigzag style along the third direction TD in the coupling regions PR.

The bit lines BL may be cut in the third direction TD on the dummy block DB. Each of the cut bit lines BL may be comprised of a first bit line section BLa and a second bit line section BLb which extend in opposite directions when viewed from the dummy block DB in the second direction SD. One end of the first bit line section BLa may overlap with one end of the dummy block DB, and one end of the second bit line section BLb may overlap with the other end of the dummy block DB.

A power pad 50 may be disposed on the first top dielectric layer 38A. The power pad 50 may be disposed at the same layer as the bit lines BL. The power pad 50 may be disposed between the first bit line sections BLa and the second bit line sections BLb of a number of bit lines BL among the cut bit lines BL, which are positioned at a center portion. In an embodiment, as illustrated in FIG. 4, the power pad 50 may be disposed between the first bit line sections BLa and the second bit line sections BLb of four bit lines BL among eight cut bit lines BL, which are positioned at a center portion.

The width of the power pad 50 in the third direction TD may be larger than the width of each bit line BL in the third direction TD. In an embodiment, the power pad 50 may have a width that is defined as the sum of four times the first width W1 and three times the first interval D1. While only one power pad 50 is illustrated in the embodiment shown in FIG. 4 for the sake of simplification in illustration, a plurality of power pads may be provided along the third direction TD.

Dummy lines 51 may be disposed on the first top dielectric layer 38A. The dummy lines 51 may be disposed at the same layer as the bit lines BL and the power pad 50. Each dummy line 51 may be disposed between the first bit line section BLa and the second bit line section BLb of each of bit lines BL among the cut bit lines BL, which are positioned at peripheries in the third direction TD. For example, each dummy line 51 may be disposed between the first bit line section BLa and the second bit line section BLb of each of four bit lines BL among the eight cut bit lines BL, which are positioned at both peripheries in the third direction TD. The width of each dummy line 51 may be substantially the same as the width of each bit line BL, and each of the interval between the dummy line 51 and the bit line BL and the interval between the dummy lines 51 may be substantially the same as the interval between the bit lines BL. For example, the width of each dummy line 51 may be substantially the same as the first width W1, and each of the interval between the dummy line 51 and the bit line BL and the interval between the dummy lines 51 may be substantially the same as the first interval D1.

Coupling lines 60 corresponding to the cut bit lines BL, respectively, may be disposed on the uppermost second interlayer dielectric layer 37B of the dummy block DB. The coupling lines 60 may extend in the second direction SD. One end of each of the coupling lines 60 may overlap with the first bit line section BLa of a corresponding bit line BL in the first direction FD, and the other end may overlap with the second bit line section BLb of the corresponding bit line BL in the first direction FD.

The width of each coupling line 60 in the third direction TD may be substantially the same as the width of each bit line BL in the third direction TD. The interval between the coupling lines 60 may be substantially the same as the interval between the bit lines BL. In this case, the pitch of the coupling lines 60 may be substantially the same as the pitch of the bit lines BL. The top surfaces and side surfaces of the coupling lines 60 may be covered by the first top dielectric layer 38A.

The power pad 50 may be coupled to the third bottom wiring line 21C of the logic structure 20 through first top contacts 81 and power coupling contacts 70.

The power coupling contacts 70 may be coupled to the third bottom wiring line 21C by passing through the coupling lines 60, the dummy block DB, the isolation dielectric layer IS and the fourth bottom dielectric layer 23D in the first direction FD. In another embodiment, the power coupling contacts 70 may be disposed between the coupling lines 60. In this case, the power coupling contacts 70 may not pass through the coupling lines 60 and may pass through only the dummy block DB, the isolation dielectric layer IS and the fourth bottom dielectric layer 23D.

A sidewall dielectric layer 72 may be disposed between the power coupling contacts 70 and the coupling lines 60 and between the power coupling contacts 70 and the dummy block DB. The sidewall dielectric layer 72 may have the shape of a straw or a cylinder shell which surrounds the outer wall of each power coupling contact 70. The power coupling contacts 70 may be electrically decoupled from the coupling lines 60 and the dummy gate electrode layers 37A of the dummy block DB by the sidewall dielectric layer 72. The first top contacts 81 may couple the power pad 50 and the power coupling contacts 70 through the first top dielectric layer 38A.

Each first bit line section BLa and one end of each coupling line 60 may be electrically coupled with each other through a second top contact 82 which passes through the first top dielectric layer 38A. Each second bit line section BLb and the other end of each coupling line 60 may be electrically coupled with each other through a third top contact 83 which passes through the first top dielectric layer 38A. That is, the first bit line section BLa and the second bit line section BLb of each of the cut bit lines BL may be electrically coupled with each other through the second top contact 82, the coupling line 60 and the third top contact 83.

A second top dielectric layer 38B may be disposed on the first top dielectric layer 38A and cover the side surfaces and top surfaces of the bit lines BL, the power pad 50 and the dummy lines 51. A power line 90 may be disposed on the second top dielectric layer 38B.

The power line 90 may extend in the second direction SD. The power line 90 may be coupled to the power pad 50 through a fourth top contact 84 which passes through the second top dielectric layer 38B. In FIG. 4, the illustration of the power line 90 and the fourth top contact 84 is omitted for the sake of simplification in illustration.

The power line 90 may be coupled to the third bottom wiring line 21C of the logic structure 20 through the fourth top contact 84, the power pad 50, the first top contacts 81 and the power coupling contacts 70. An operating voltage provided to the power line 90 may be transferred to peripheral circuit elements, for example, the logic transistors TR through the fourth top contact 84, the power pad 50, the first top contacts 81, the power coupling contacts 70, the third bottom wiring line 21C, the third bottom contact 22C, the second bottom wiring line 21B, the second bottom contact 22B, the first bottom wiring line 21A and the first bottom contact 22A. The operating voltage may include any one among a power supply voltage, a ground voltage and a source voltage.

Figure 6:
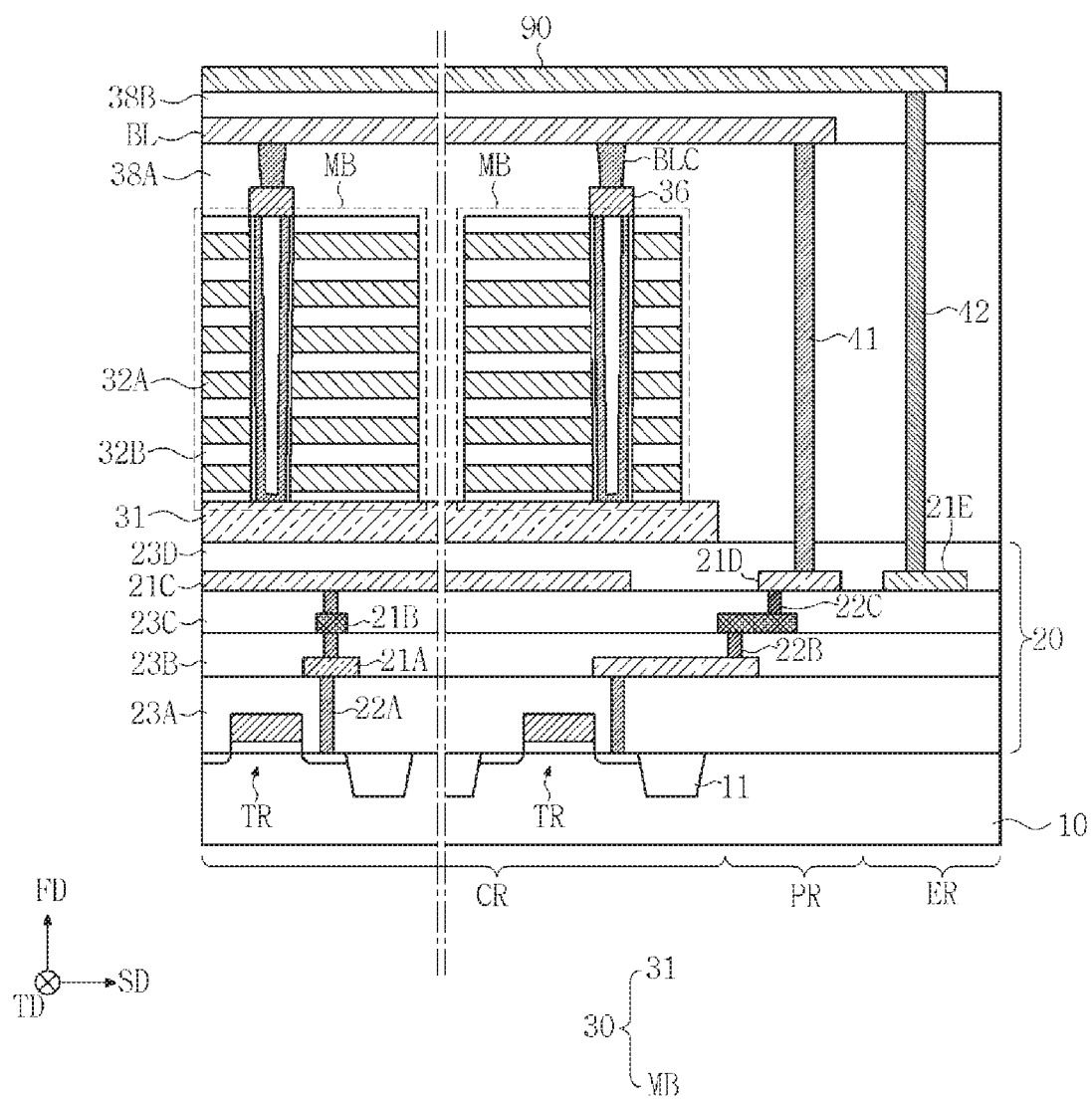
FIG. 6 is a cross-sectional view illustrating a representation of an example of a semiconductor memory device related with the embodiment.

FIG. 6 is a cross-sectional view illustrating a representation of an example of a semiconductor memory device related with the embodiment.

Referring to FIG. 6, bit lines BL may not be cut in a circuit region CR. In this case, since an electrical path which couples a power line 90 and peripheral circuit elements may not be configured in the circuit region CR and a coupling region PR where the bit lines BL are repeatedly disposed, an electrical path which couples the power line 90 and logic transistors TR should be configured in an edge region ER over which the bit lines BL are not disposed.

To this end, the power line 90 should be extended into the edge region ER, a fourth bottom wiring line 21E should be disposed on a third bottom dielectric layer 23C in the edge region ER, and the power line 90 and the fourth bottom wiring line 21E should be electrically coupled through a second coupling contact 42 which passes through second and first top dielectric layers 38B and 38A and a fourth bottom dielectric layer 23D. Further, a wiring line (not shown) which couples the fourth bottom wiring line 21E and a third bottom wiring line 21C should be disposed on the third bottom dielectric layer 23C. The wiring line should traverse the coupling region PR which is disposed between the edge region ER where the fourth bottom wiring line 21E is positioned and the circuit region CR where the third bottom wiring line 21C is positioned. However, because coupling pads 21D are repeatedly arranged in the coupling region PR, it is not easy to dispose the wiring line by avoiding the coupling pads 21D, and for this reason, the number of wiring lines to be disposed cannot help but be limited.

In order to stably provide an operating voltage to the peripheral circuit elements, power transfer paths should be sufficiently secured. In this regard, if the number of wiring lines is limited as described above, the number of power transfer paths may not be secured, and an operating voltage may not be stably provided to the peripheral circuit elements.

According to the present embodiment, the bit lines BL are cut in the circuit region CR, and power transfer paths for transferring an operating voltage to the peripheral circuit elements may be configured through a space that is provided by the cut bit lines BL. Therefore, since the number of power transfer paths may be sufficiently secured by avoiding a spatial limitation due to the presence of the coupling pads 21D, it is possible to stably provide an operating voltage to the peripheral circuit elements.

Figure 7:
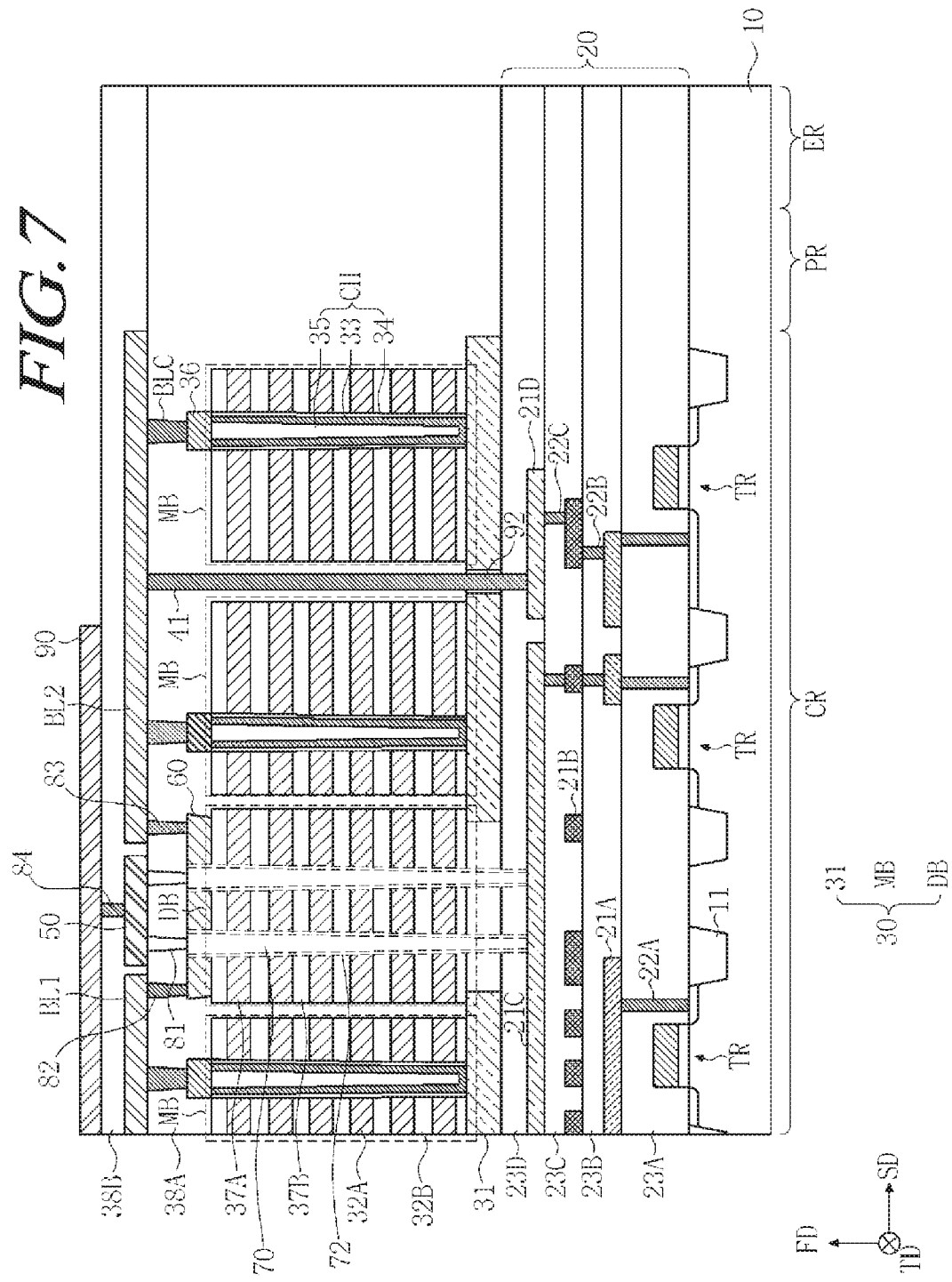
FIG. 7 is a cross-sectional view illustrating a representation of an example of a semiconductor memory device in accordance with an embodiment.

FIG. 7 is a cross-sectional view illustrating a representation of an example of a semiconductor memory device in accordance with an embodiment.

Referring to FIG. 7, the coupling pads 21D and the first coupling contacts 41 are not disposed in the coupling regions PR but in the circuit region CR.

Each of the coupling pads 21D may be disposed to overlap with a corresponding bit line BL in the first direction FD in the circuit region CR. Each of the first coupling contacts 41 may be disposed between memory blocks MB in the circuit region CR, and may pass through a first top dielectric layer 38A, a semiconductor layer 31 and a fourth bottom dielectric layer 23D. A dielectric layer 92 may be formed between the first coupling contact 41 and the semiconductor layer 31, and may electrically isolate the first coupling contact 41 and the semiconductor layer 31.

Figure 8:
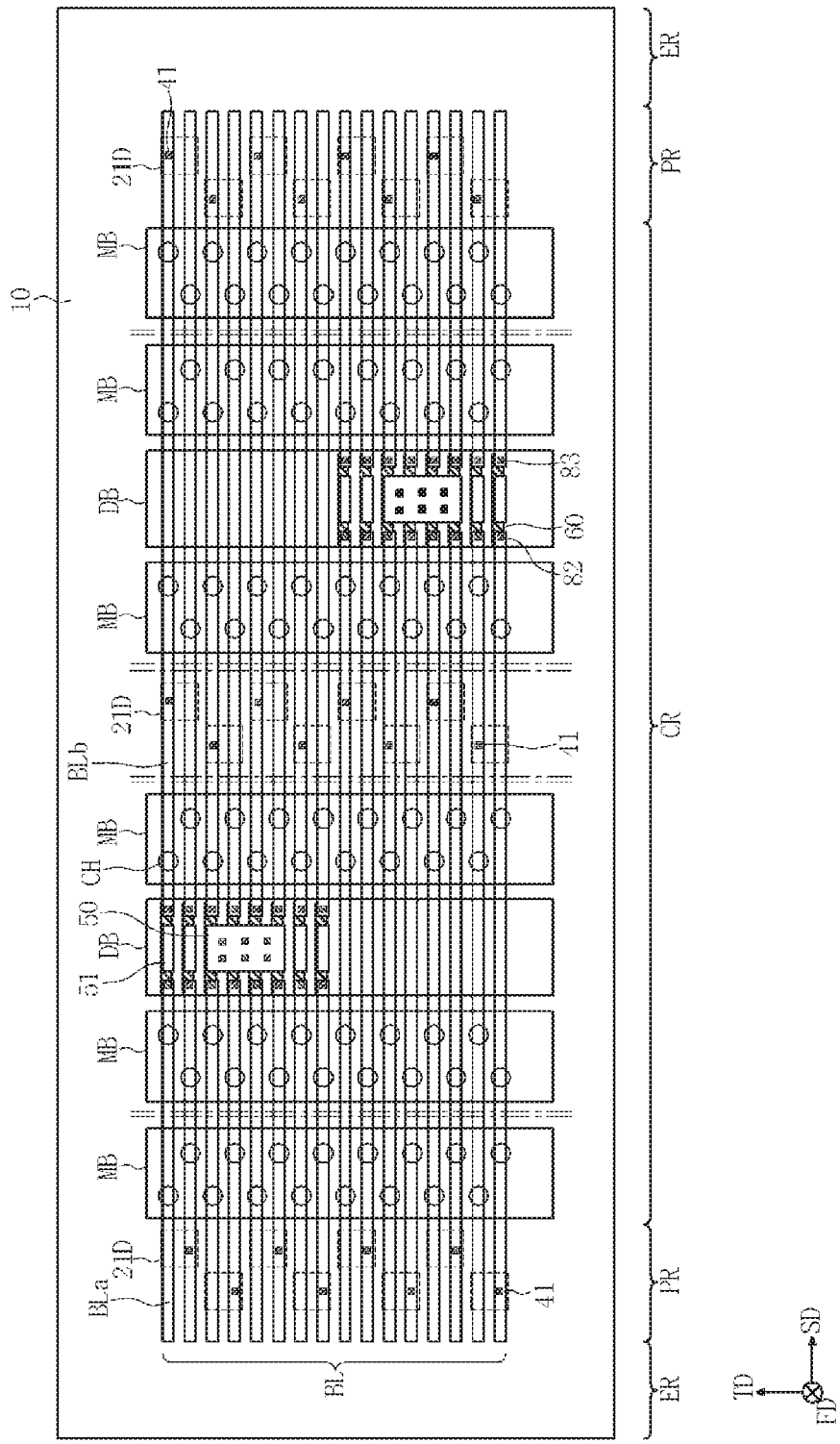
FIG. 8 is a top view illustrating a representation of an example of a semiconductor memory device in accordance with an embodiment.

FIG. 8 is a top view illustrating a representation of an example of a semiconductor memory device in accordance with an embodiment.

Referring to FIG. 8, the coupling pads 21D and the first coupling contacts 41 are disposed both in the coupling regions PR and also in the circuit region CR.

A memory structure may include a plurality of memory blocks MB and a plurality of dummy blocks DB1 and DB2. The memory blocks MB and the dummy blocks DB1 and DB2 may be arranged along the second direction SD. In an embodiment, the dummy blocks DB1 and DB2 may include a first dummy block DB1 and a second dummy block DB2. At least one memory block MB and coupling pads 21D may be disposed between the first dummy block DB1 and the second dummy block DB2.

Each of the bit lines BL may be cut over one corresponding dummy block of the first and second dummy blocks DB1 and DB2. In an embodiment, a number of the bit lines BL may be cut over the first dummy block DB1, and the remainder may be cut over the second dummy block DB2. The bit lines BL which are cut over the first dummy block DB1 may not be cut over the second dummy block DB2. Also, the bit lines BL which are cut over the second dummy block DB2 may not be cut over the first dummy block DB1. A power pad 50 may be disposed in a space that is provided by the bit lines BL cut over the first dummy block DB1. A power pad 50 may be disposed in a space that is provided by the bit lines BL cut over the second dummy block DB2. Due to the fact that the bit lines BL cut over the first dummy block DB1 and the bit lines BL cut over the second dummy block DB2 are different, the power pad 50 disposed over the first dummy block DB1 and the power pad 50 disposed over the second dummy block DB2 may not be disposed in a line in the second direction SD and may be disposed in a zigzag style in the second direction SD.

As aforementioned, each of the cut bit lines BL may include a first bit line section BLa and a second bit line section BLb. The first bit line section BLa and the second bit line section BLb of each of the cut bit lines BL may be electrically coupled with each other through a coupling line 60 (see also FIG. 5), a second top contact 82 (see also FIG. 5) and the third top contact 83 (see also FIG. 5).

Since the cut portions of each of the bit lines BL are coupled through the coupling line 60 and the second and third top contacts 82 and 83, in the case where only partial bit lines BL are cut, differences may be caused in terms of resistance value and capacitance value between bit lines BL which are cut and bit lines BL which are not cut. Due to such differences in resistance value and capacitance value between the bit lines BL, a deviation in RC delay time may occur between the bit lines BL, whereby the electrical characteristic of the semiconductor memory device may degrade.

According to the present embodiment, since each of all bit lines BL is cut over a corresponding dummy block and the cut portions of each bit line BL are coupled through the coupling line 60 and the second and third top contacts 82 and 83, the bit lines BL may have substantially the same resistance value and capacitance value. Therefore, since a deviation in RC delay time does not occur between the bit lines BL, the electrical characteristic of the semiconductor memory device may be improved.

Figure 9:
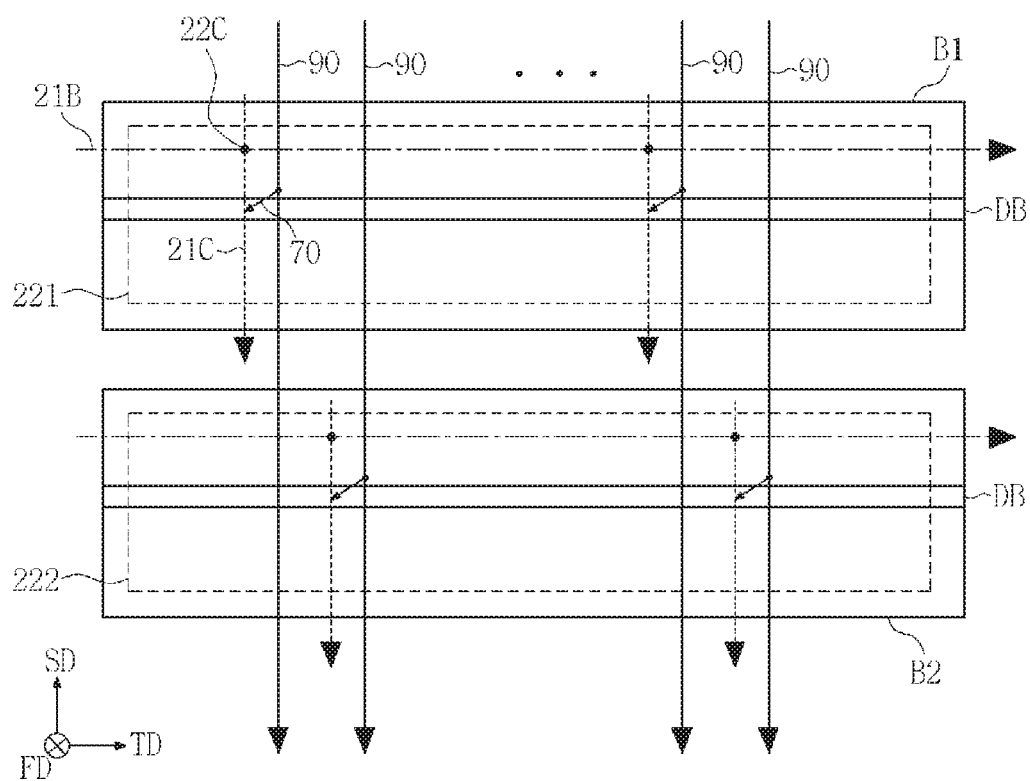
FIGS. 9 and 10 are top views schematically illustrating representations of examples of the layouts of semiconductor memory devices in accordance with embodiments.
Figure 10:
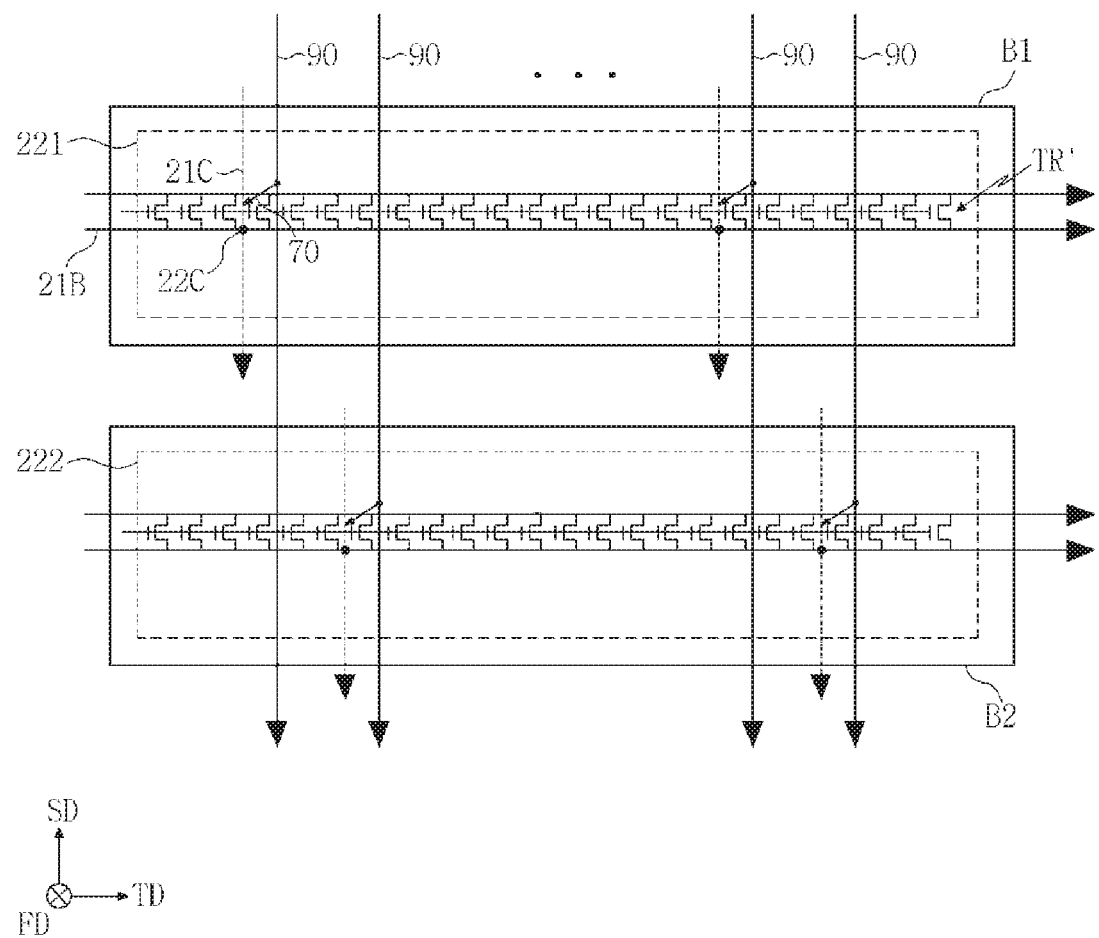

FIGS. 9 and 10 are top views schematically illustrating representations of examples of the layouts of semiconductor memory devices in accordance with embodiments.

Referring to FIG. 9, a memory cell array may include a first memory bank B1 and a second memory bank B2. The memory cell array configured by the first and second memory banks B1 and B2 may be defined as one plane.

A peripheral circuit may be disposed under the memory cell array. The peripheral circuit may include a page buffer circuit. The page buffer circuit may include a first page buffer unit 221 corresponding to the first memory bank B1 and a second page buffer unit 222 corresponding to the second memory bank B2. Each of the first page buffer unit 221 and the second page buffer unit 222 may be disposed to overlap with a corresponding memory bank in the first direction FD.

Power lines 90 which extend in the second direction SD may be disposed over the first and second memory banks B1 and B2. Each of the first and second memory banks B1 and B2 may include a plurality of memory blocks (not shown) and a dummy block DB. The dummy block DB may be disposed in the center portion of each of the first and second memory banks B1 and B2 in the second direction SD. The power lines 90 may be coupled to third bottom wiring lines 21C through power coupling contacts 70 which pass through each dummy block DB. The third bottom wiring lines 21C may extend in the second direction SD. The third bottom wiring lines 21C may be coupled to second bottom wiring lines 21B through third bottom contacts 22C. The second bottom wiring lines 21B may extend in the third direction TD. As described above with reference to FIG. 5, the second bottom wiring lines 21B may be electrically coupled to logic transistors (see TR of FIG. 5) configuring each of the first page buffer unit 221 and the second page buffer unit 222, through second bottom contacts (see 22B of FIG. 5), first bottom wiring lines (see 21A of FIG. 5) and first bottom contacts (see 22A of FIG. 5). By such a structure, the operating voltages provided to the power lines 90 may be transferred to the first and second page buffer units 221 and 222 which are disposed under the first and second memory banks B1 and B2.

Referring to FIG. 10, a peripheral circuit may include a page buffer circuit and a plurality of power transfer transistors TR'.

The page buffer circuit may include a first page buffer unit 221 corresponding to a first memory bank B1 and a second page buffer unit 222 corresponding to a second memory bank B2. Each of the first page buffer unit 221 and the second page buffer unit 222 may be disposed to overlap with a corresponding memory bank in the first direction FD.

The power transfer transistors TR' may be disposed at the center portion of each of the first and second page buffer units 221 and 222 in the second direction SD. The power transfer transistors TR' may be electrically coupled to power lines 90 through the drain terminals thereof, and may transfer the external voltages provided through the power lines 90 to the voltage generator of the peripheral circuit (200 in FIG. 1) in response to the control signals inputted to the gate terminals thereof.

The power lines 90 which extend in the second direction SD may be disposed over the first and second memory banks B1 and 32. Each of the first and second memory banks 31 and 32 may include a plurality of memory blocks (not shown) and a dummy block (not shown). The dummy block may be disposed in the center portion of each of the first and second memory banks B1 and 32 in the second direction SD. The power lines 90 may be coupled to third bottom wiring lines 21C of a logic structure (see 20 of FIG. 5) through power coupling contacts 70 which pass through each dummy block. The third bottom wiring lines 21C may be coupled to second bottom wiring lines 21B through third bottom contacts 22C. The second bottom wiring lines 21B may extend in the third direction TD. Similarly to the descriptions made above with reference to FIG. 5, the second bottom wiring lines 213 may be electrically coupled to the drain terminals of the power transfer transistors TR', through second bottom contacts (see 22B of FIG. 5), first bottom wiring lines (see 21A of FIG. 5) and first bottom contacts (see 22A of FIG. 5). By such a structure, the operating voltages provided to the power lines 90 may be transferred to the power transfer transistors transistors TR' which are disposed under the first and second memory banks B1 and B2.

According to the embodiments, by cutting bit lines disposed on a memory structure, a power transfer path which couples a power line disposed on the bit lines with peripheral circuit elements included in a logic structure disposed under the memory structure may be constructed through a space defined by the cut bit lines. Therefore, since the number of power transfer paths may be sufficiently secured by avoiding a spatial limitation due to the presence of coupling pads disposed in a bottom wiring layer of the logic structure, it is possible to stably provide operating voltages to the peripheral circuit elements.

Figure 11:
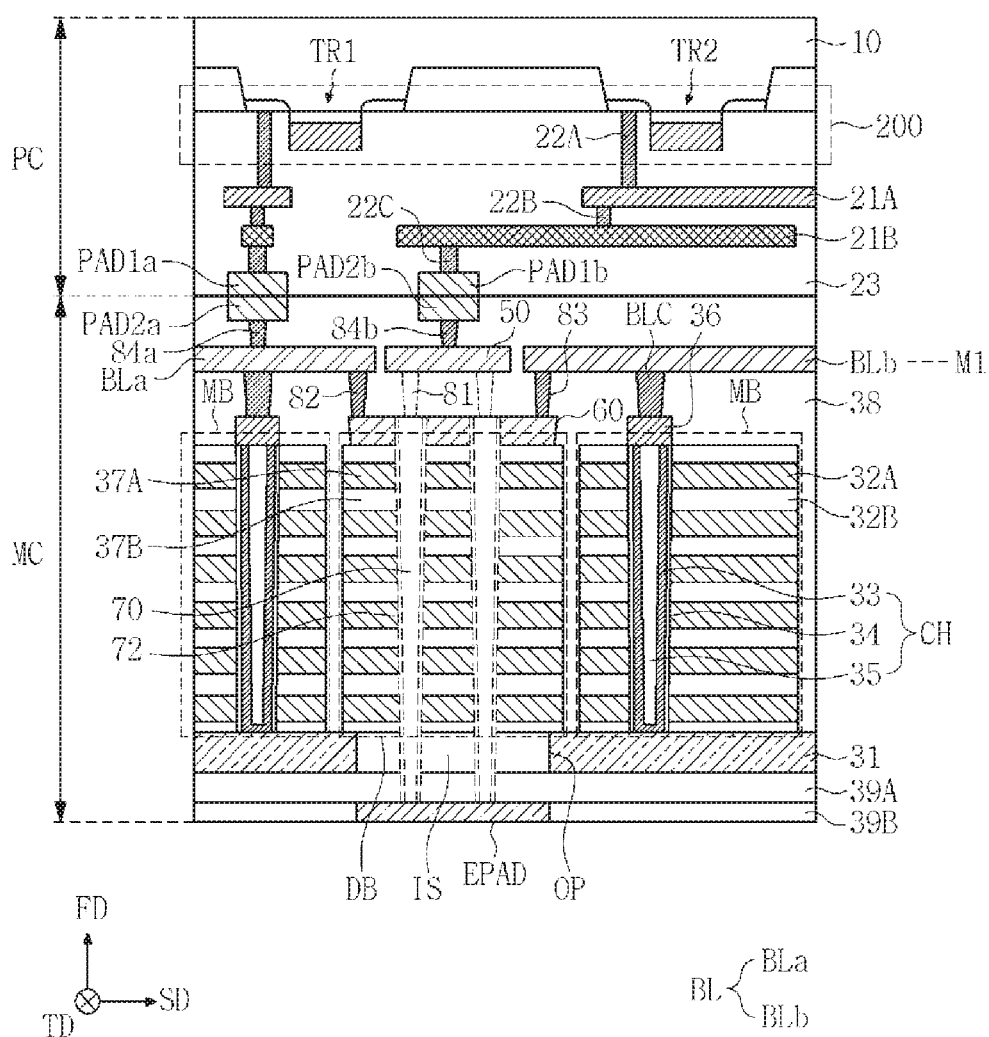
FIG. 11 is a cross-sectional view illustrating a representation of an example of a semiconductor memory device in accordance with an embodiment of the disclosure.

FIG. 11 is a cross-sectional view illustrating a representation of an example of a semiconductor memory device in accordance with an embodiment of the disclosure.

Referring to FIG. 11, the semiconductor memory device in accordance with the embodiment of the disclosure may have a POC (peripheral over cell) structure. A circuit chip PC may be disposed on a memory chip MC. The circuit chip PC may include a peripheral circuit 200, and the memory chip MC may include a memory cell array (100 of FIG. 1). The circuit chip PC and the memory chip MC may be manufactured on different wafers and be then bonded to each other.

The circuit chip PC may include a substrate 10 and the peripheral circuit 200 which is defined on the substrate 10. The reference symbols TR1 and TR2 of FIG. 11 designate transistors which configure the peripheral circuit 200. For example, the reference symbol TR1 designates a bit line select transistor of a page buffer, and the reference symbol TR2 designates a power transmission transistor.

A dielectric layer 23 may be defined on the substrate 10 to cover the peripheral circuit 200. The top surface of the dielectric layer 23 may constitute one surface of the circuit chip PC which is bonded with the memory chip MC. The circuit chip PC may include a plurality of pads PAD1a and PAD1b on the one surface which is bonded with the memory chip MC. Each of the pads PAD1a and PAD1b may be coupled to one of the transistors TR1 and TR2 through wiring lines 21A and 21B and contacts 22A, 22B and 22C which are defined in the dielectric layer 23. The pad PAD1a represents a pad which is coupled to the bit line select transistor TR1, and the pad PAD1b represents a pad which is coupled to the power transmission transistor TR2.

The memory chip MC may include a semiconductor layer 31 and the memory cell array which is defined on the semiconductor layer 31. The semiconductor layer 31 may be disposed on a base dielectric layer 39A. The memory cell array may include a plurality of memory blocks MB and at least one dummy block DB. The semiconductor layer 31 may have an opening OP passing through the top surface and the bottom surface thereof. The opening OP may overlap with the dummy block DB in the first direction FD. An isolation dielectric layer IS may be defined in the opening OP.

The memory blocks MB and the dummy block DB may be arranged in the second direction SD being the extending direction of bit lines BL, and may be spaced apart from each other by a predetermined interval. Each of the memory blocks MB may include a plurality of gate electrode layers 32A and a plurality of first interlayer dielectric layers 32B which are alternately stacked, and a plurality of channel structures CH which pass through the plurality of gate electrode layers 32A and the plurality of first interlayer dielectric layers 32B stacked alternately. Each of the channel structures CH may include a channel layer 33 and a gate dielectric layer 34 as described above with reference to FIG. 5. Conductive pads 36 may be defined on the channel structures CH to be coupled with the channel layers 33 of the channel structures CH, respectively. The conductive pads 36 may include a silicon material which is doped with an impurity.

The dummy block DB may include a plurality of dummy gate electrode layers 37A and a plurality of second interlayer dielectric layers 37B which are alternately stacked. A dielectric layer 38 may be defined on the base dielectric layer 39A to cover the semiconductor layer 31, the memory blocks MB and the dummy block DB. The top surface of the dielectric layer 38 may constitute one surface of the memory chip MC which is bonded with the circuit chip PC. The memory chip MC may include a plurality of pads PAD2a and PAD2b on the one surface which is bonded with the circuit chip PC. The pad PAD2a may be bonded to the pad PAD1a of the circuit chip PC, and the pad PAD2b may be bonded to the pad PAD1b of the circuit chip PC.

The bit lines BL may be disposed in a first wiring layer M1 between the one surface of the memory chip MC and the memory cell array. The bit lines BL may extend in the second direction SD. Bit line contacts BLC may be defined under the bit lines BL to couple the bit lines BL and the conductive pads 36.

As each bit line BL is cut on the dummy block DB, the bit line BL may be separated into a first bit line section BLa and a second bit line section BLb. The first bit line section BLa and the second bit line section BLb may extend in opposite directions based on the dummy block DB.

A power pad 50 may be disposed in a space which is defined in the first wiring layer M1 as the bit line BL is cut. The power pad 50 may be disposed between the first bit line section BLa and the second bit line section BLb in the first wiring layer M1. The power pad 50 may be formed at the same process step as the bit line BL, and may be made of the same material as the bit line BL.

A contact 84a may be defined under the pad PAD2a to couple the pad PAD2a and the bit line BL. A contact 84b may be defined under the pad PAD2b to couple the pad PAD2b and the power pad 50.

A coupling line 60 may be disposed on the dummy block DB. The coupling line 60 may be formed at the same process step as the conductive pads 36. Accordingly, the coupling line 60 may be disposed in the same layer and be made of the same material as the conductive pads 36. The coupling line 60 may extend in the second direction SD. One end of the coupling line 60 may overlap with the first bit line section BLa of the bit line BL in the first direction FD, and the other end of the coupling line 60 facing away from the one end may overlap with the second bit line section BUD of the bit line BL in the first direction FD.

Power coupling contacts 70 which pass through the dummy block DB may be defined. In the present embodiment, the power coupling contacts 70 may pass through the coupling line 60, the dummy block DB, the isolation dielectric layer IS and the base dielectric layer 39A. Although the present embodiment illustrates a case where the power coupling contacts 70 pass through the coupling line 60, it is to be noted that the disclosure is not limited thereto. In another embodiment, the power coupling contacts 70 may pass through the dummy block DB, the isolation dielectric layer IS and the base dielectric layer 39A in regions where the coupling line 60 is not positioned. In this case, the power coupling contacts 70 may not pass through the coupling line 60.

Sidewall dielectric layers 72 may be defined on the outer walls of the power coupling contacts 70 to isolate the power coupling contacts 70 and the coupling line 60 from each other and isolate the power coupling contacts 70 and the dummy block DB from each other. Each of the sidewall dielectric layers 72 may have the shape of a straw or a cylinder shell which surrounds the outer wall of each power coupling contact 70. Contacts 81 may be defined under the power pad 50 to couple the power pad 50 and the power coupling contacts 70.

A contact 82 may be defined in a region where the coupling line 60 and the first bit line section BLa overlap with each other, to couple the coupling line 60 and the first bit line section BLa. A contact 83 may be defined in a region where the coupling line 60 and the second bit line section BLb overlap with each other, to couple the coupling line 60 and the second bit line section BLb. Accordingly, the first bit line section BLa and the second bit line section BLb may be electrically coupled to each other through the contact 82, the coupling line 60 and the contact 83.

An external coupling pad EPAD which is coupled to the power coupling contacts 70 may be defined on the backside of the base dielectric layer 39A, that is, the bottom surface of the base dielectric layer 39A which faces away from the top surface of the base dielectric layer 39A facing the semiconductor layer 31 and the isolation dielectric layer IS. The external coupling pad EPAD may correspond to a contact of the semiconductor memory device for electrical coupling with an external device. The external coupling pad EPAD may be coupled to a mounting substrate or another semiconductor device through a coupling member such as a solder ball, a conductive bump or a wire. The semiconductor memory device may be provided with power from the external device through the external coupling pad EPAD. The external coupling pad EPAD may be coupled to the peripheral circuit 200 through the power coupling contacts 70, the contacts 81, the power pad 50, the contact 84b, the pad PAD2b, the pad PAD1b, the contacts 22A to 22C and the wiring lines 21A and 21B. The external coupling pad EPAD, the power coupling contacts 70, the contacts 81, the power pad 50, the contact 84b, the pad PAD2b, the pad PAD1b, the contacts 22A to 22C and the wiring lines 21A and 21B may configure a power transmission path for transferring power inputted from the external device, to the peripheral circuit 200. A passivation layer 39B may be defined on the backside of the base dielectric layer 39A to cover the base dielectric layer 39A and expose the external coupling pad EPAD. The bottom surfaces of the passivation layer 39B and the external coupling pad EPAD may constitute the other surface of the memory chip MC.

Figure 12:
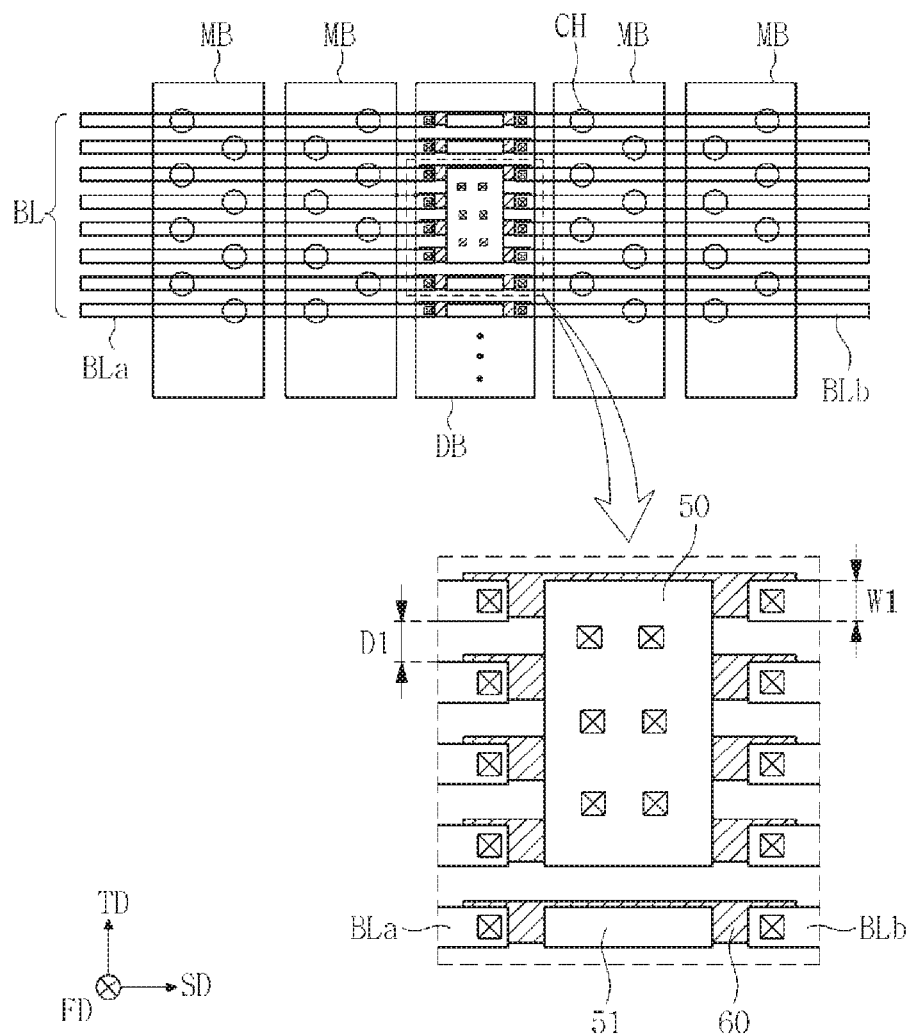
FIG. 12 is a top view illustrating a representation of an example of a partial configuration of a memory chip included in the semiconductor memory device illustrated FIG. 11.

FIG. 12 is a top view illustrating a representation of an example of a partial configuration of a memory chip included in the semiconductor memory device illustrated FIG. 11.

Referring to FIG. 12, the plurality of memory blocks MB may be arranged in the second direction SD. The dummy block DB may be disposed between adjacent memory blocks MB. The plurality of bit lines BL may be defined over the memory blocks MB and the dummy block DB. The bit lines BL may extend in the second direction SD and be arranged in the third direction TD. The bit lines BL may be cut over the dummy block DB. Each of the cut bit lines BL may be separated into the first bit line section BLa and the second bit line section BLb which extend in opposite directions based on the dummy block DB. The power pad 50 may be disposed between first bit line sections BLa and second bit line sections BLb of some bit lines BL among the cut bit lines BL. The present embodiment illustrates a case where the power pad 50 is disposed between first bit line sections BLa and second bit line sections BLb of four bit lines BL which are positioned at a center part, among eight cut bit lines BL.

The width of the power pad 50 in the third direction TD may be larger than the width of the bit line BL in the third direction TD. In the present embodiment, the width of the power pad 50 in the third direction TD may have a size that is defined by the sum of four times a width W1 of the bit line BL in the third direction TD and three times an interval D1 between bit lines BL in the third direction TD.

A dummy line 51 may be disposed between the first bit line section BLa and the second bit line section BLb of each of bit lines BL which are positioned at peripheral parts, among the cut bit lines BL. In the present embodiment, the dummy line 51 is disposed between the first bit line section BLa and the second bit line section BLb of each of four bit lines BL which are disposed at peripheral parts, among the eight cut bit lines BL. The dummy line 51 may be formed at the same process step as the bit lines BL and the power pad 50. Accordingly, the dummy line 51 may be disposed in the same layer and be made of the same material as the bit lines BL and the power pad 50.

The width of the coupling line 60 in the third direction TD may be substantially the same as the width of the bit line BL in the third direction TD. The interval between adjacent coupling lines 60 in the third direction TD may be substantially the same as the interval between adjacent bit lines BL in the third direction TD. In this case, the pitch of coupling lines 60 in the third direction TD may be substantially the same as the pitch of the bit lines BL in the third direction TD.

According to the embodiment of the disclosure, the bit lines BL of the memory chip MC may be cut, and power transmission paths which couple the external coupling pad EPAD and the peripheral circuit 200 may be configured using the space that is formed as the bit lines BL are cut. Therefore, since the number of power transmission paths may be secured sufficiently, a voltage may be stably provided to the peripheral circuit 200 of the circuit chip PC. Also, since the power transmission paths may be configured inside the memory cell array, a layout area to be consumed for configuring the power transmission paths may be reduced, whereby it is possible to contribute to the size reduction of the semiconductor memory device.

Figure 13:
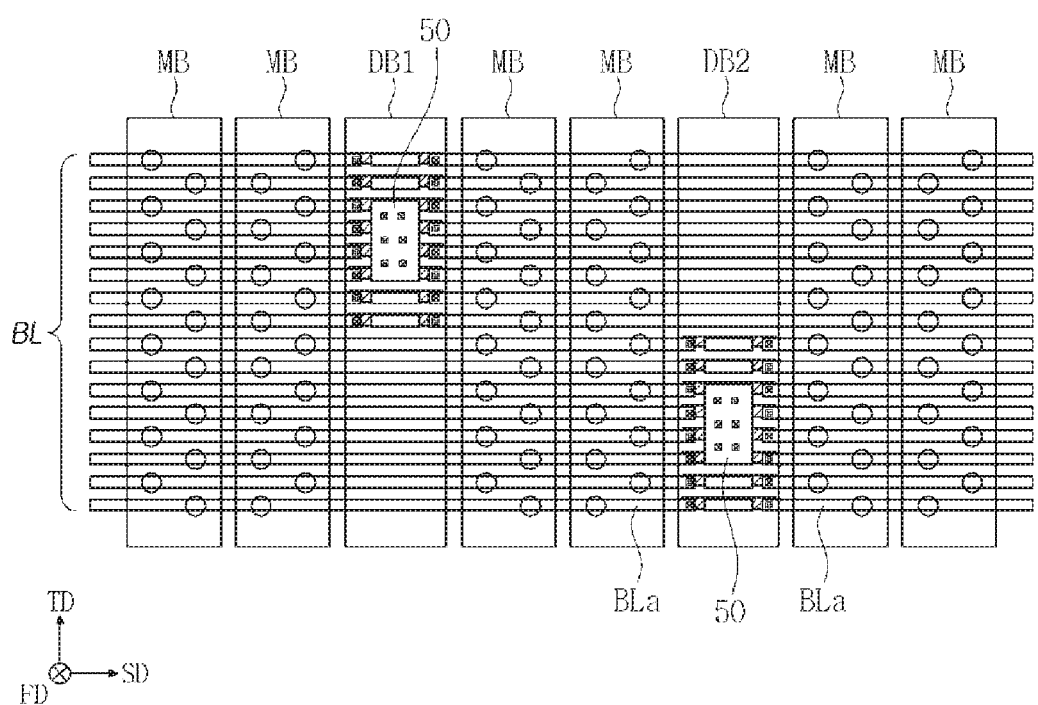
FIG. 13 is a top view illustrating a representation of an example of a partial configuration of a memory chip included in a semiconductor memory device in accordance with an embodiment of the disclosure.

FIG. 13 is a top view illustrating a representation of an example of a partial configuration of a memory chip included in a semiconductor memory device in accordance with an embodiment of the disclosure.

Referring to FIG. 13, a plurality of memory blocks MB and a plurality of dummy blocks DB1 and DB2 may be arranged in the second direction SD. In the present embodiment, the dummy blocks DB1 and DB2 may include a first dummy block DB1 and a second dummy block DB2. One or more memory blocks MB may be disposed between the first dummy block DB1 and the second dummy block DB2.

Each of bit lines BL may be cut over one corresponding dummy block of the first and second dummy blocks DB1 and DB2. In the embodiment, some of the bit lines BL may be cut over the first dummy block DB1, and the remainder may be cut over the second dummy block DB2. The bit lines BL which are cut over the first dummy block DB1 may not be cut over the second dummy block DB2. Also, the bit lines BL which are cut over the second dummy block DB2 may not be cut over the first dummy block DB1. Power pads 50 may be disposed in a space that is provided by the bit lines BL cut over the first dummy block DB1 and a space that is provided by the bit lines BL cut over the second dummy block DB2, respectively. In this case, one of the power pads 50 may be disposed over the first dummy block DB1, and the other of the power pads 50 may be disposed over the second dummy block DB2.

The power pad 50 which is disposed over the first dummy block DB1 and the power pad 50 which is disposed over the second dummy block DB2 may be arranged in an oblique direction that intersects with the second direction SD and the third direction TD. Although not illustrated, a plurality of external coupling pads (see EPAD of FIG. 11) corresponding to the power pads 50 may be defined on the other surface of the memory chip. Each of the external coupling pads may be coupled to a corresponding power pad 50 through power coupling contacts (70 of FIG. 11) and contacts (81 of FIG. 11).

As aforementioned, each of the bit lines BL may be separated into a first bit line section BLa and a second bit line section BLb by a cutting process. The first bit line section BLa and the second bit line section BLb of each of the cut bit lines BL may be electrically coupled with each other through a coupling line (60 of FIG. 11) and contacts (82 and 83 of FIG. 11).

Due to the resistance and capacitance of the coupling line (60 of FIG. 11) and the contacts (82 and 83 of FIG. 11), a cut bit line BL and an uncut bit line BL may have different resistance values and capacitance values. In this case, a deviation in RC delay time may occur between the bit lines BL, thereby degrading the electrical characteristics of the semiconductor memory device.

According to the present embodiment, since each of all the bit lines BL is cut over a corresponding dummy block and cut portions of each bit line BL are coupled through the coupling line 60 and the contacts 82 and 83, the bit lines BL may have substantially the same resistance value and the same capacitance value. Therefore, since a deviation in RC delay time between the bit lines BL may be reduced or eliminated, the electrical characteristics of the semiconductor memory device may be improved.

Figure 14:
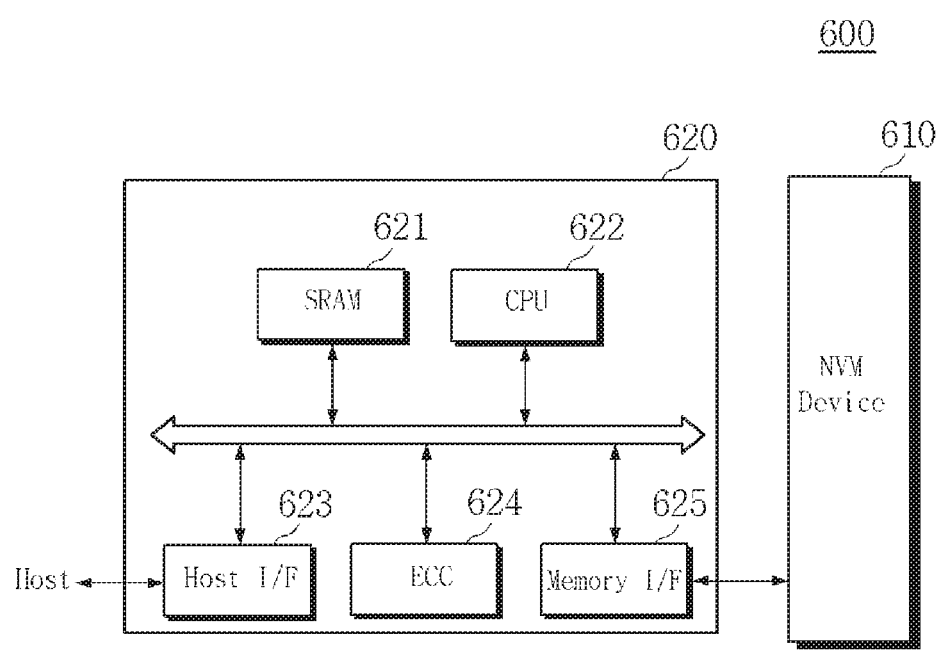
FIG. 14 is a simplified block diagram schematically illustrating a memory system including a semiconductor memory device in accordance with an embodiment.

FIG. 14 is a block diagram schematically illustrating a representation of an example of a memory system including a semiconductor memory device in accordance with an embodiment of the disclosure.

Referring to FIG. 14, the memory system 600 may include the semiconductor memory device 610 and a memory controller 620.

The semiconductor memory device 610 may comprise the memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid-state disk (SSD). The memory controller 620 may include an SRAM 621, a central processing unit (CPU) 622, a host interface 623, an ECC block 624, and a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid-state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 15:
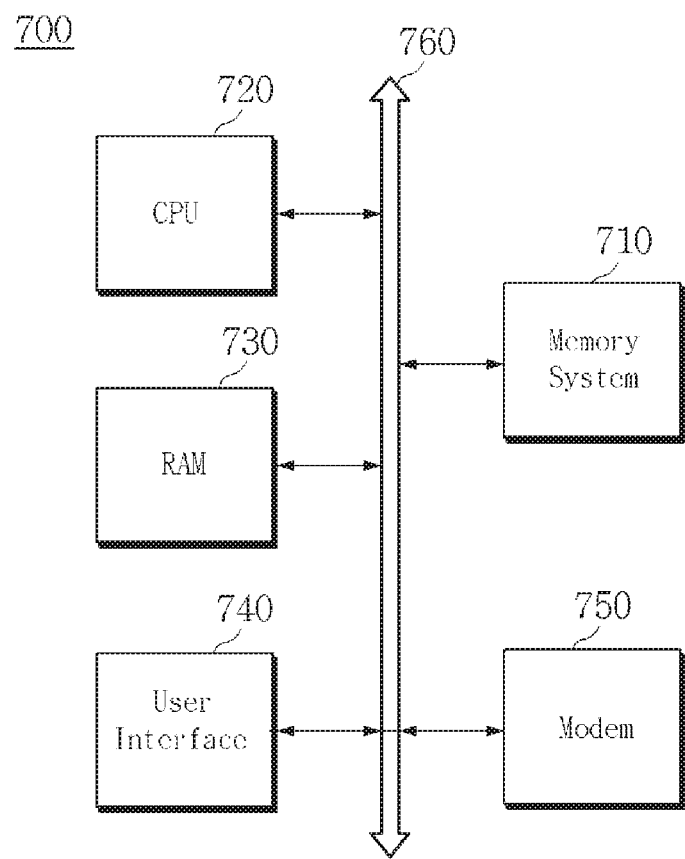
FIG. 15 is a simplified block diagram schematically illustrating a computing system including a semiconductor memory device in accordance with an embodiment.

FIG. 15 is a simplified block diagram schematically illustrating a computing system including a memory device, according to an embodiment of the present invention.

Referring to FIG. 15, a computing system 700 according to an embodiment may include a memory system 710, a microprocessor (or CPU) 720, a RAM 730, a user interface 740, a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a CAMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

It is noted that the above-described embodiments may be realized not only by a device and a method, but may be realized also by a program which performs the function or functions corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a memory chip defined with a first pad, the memory chip having a first side; and
a circuit chip defined with a second pad which is coupled with the first pad, wherein one surface of the circuit chip is bonded to the first side of the memory chip,
the memory chip comprising:
a memory cell array;
a bit line disposed in a first wiring layer between the first side of the memory chip and the memory cell array, and separated into a first bit line section and a second bit line section, wherein, at the first side of the memory chip, the first bit line section and the second bit line section are coupled to the memory cell array through a plurality of bit line contacts; and
a power pad disposed in a space between the first bit line section and the second bit line section in the first wiring layer, and coupled with the first pad.

2. The semiconductor memory device according to claim 1, further comprising:
an external coupling pad disposed on another surface of the memory chip which faces away from the one surface, and provided with power from an external device; and
a power coupling contact passing through the memory cell array, and coupling the power pad and the external coupling pad.

3. The semiconductor memory device according to claim 2, wherein
the circuit chip includes a peripheral circuit which is coupled to the second pad, and
the external coupling pad, the power coupling contact, the power pad, the first pad and the second pad configure a power transmission path for transferring power received from the external device, to the peripheral circuit.

4. The semiconductor memory device according to claim 2, wherein
the memory cell array includes a memory block and a dummy block through which the power coupling contact passes,
the memory block includes a plurality of gate electrode layers and a plurality of first interlayer dielectric layers which are alternately stacked, and vertical channels which pass through the plurality of gate electrode layers and the plurality of first interlayer dielectric layers stacked alternately, and
the dummy block includes a plurality of dummy gate electrode layers and a plurality of second interlayer dielectric layers which are alternately stacked.

5. The semiconductor memory device according to claim 4, wherein the memory block and the dummy block are arranged in an extending direction of the bit line.

6. The semiconductor memory device according to claim 4, further comprising:
a coupling line disposed on the dummy block, and extending in a direction parallel to the bit line;
a first contact coupling the first bit line section and one end of the coupling line; and
a second contact coupling the second bit line section and the other end of the coupling line.

7. The semiconductor memory device according to claim 6, wherein the coupling line has the same width as the bit line.

8. The semiconductor memory device according to claim 2, wherein
the memory chip further includes a semiconductor layer which supports the memory cell array, and
the semiconductor layer includes an opening which accommodates an isolation dielectric layer through which the power coupling contact passes.

9. The semiconductor memory device according to claim 1, wherein a width of the power pad in a direction perpendicular to the extending direction of the bit line is larger than a width of the bit line.

10. A semiconductor memory device comprising:
a memory chip defined with a plurality of first pads, the memory chip having a first side; and
a circuit chip defined with a plurality of second pads which are coupled with the plurality of first pads, wherein one surface of the circuit chip is bonded to the first side of the memory chip,
the memory chip comprising:
a memory cell array including a plurality of memory blocks and a plurality of dummy blocks;
a plurality of bit lines disposed in a first wiring layer between the first side of the memory chip and the memory cell array, and each cut over a corresponding dummy block, wherein, at the first side of the memory chip, a first bit line section and a second bit line section are coupled to the memory cell array through a plurality of bit line contacts; and
a plurality of power pads disposed in spaces in the first wiring layer, respectively, which are provided by cut bit lines, and coupled with the first pads, respectively.

11. The semiconductor memory device according to claim 10, wherein the power pads are arranged in an oblique direction that intersects with an extending direction of the bit lines and an arrangement direction of the bit lines.

12. The semiconductor memory device according to claim 10, further comprising:
a plurality of external coupling pads disposed on another surface of the memory chip which faces away from the one surface, and provided with power from an external device; and
a plurality of power coupling contacts passing through the dummy blocks, and coupling the power pads and the external coupling pads.

13. The semiconductor memory device according to claim 10, wherein
each of the memory blocks includes a plurality of gate electrode layers and a plurality of first interlayer dielectric layers which are alternately stacked, and vertical channels which pass through the plurality of gate electrode layers and the plurality of first interlayer dielectric layers stacked alternately, and
each of the dummy blocks includes a plurality of dummy gate electrode layers and a plurality of second interlayer dielectric layers which are alternately stacked.

14. The semiconductor memory device according to claim 10, wherein the memory blocks and the dummy blocks are arranged in the extending direction of the bit lines.

15. The semiconductor memory device according to claim 10, wherein each of the bit lines includes a first bit line section and a second bit line section which are spaced apart from each other with one of the power pads interposed therebetween.

16. The semiconductor memory device according to claim 15, further comprising:
a plurality of coupling lines disposed on the dummy blocks, and extending in a direction parallel to the bit lines;
a plurality of first contacts coupling first bit line sections of the bit lines and one ends of the coupling lines; and
a plurality of second contacts coupling second bit line sections of the bit lines and the other ends of the coupling lines.

17. The semiconductor memory device according to claim 16, wherein the coupling lines have the same pitch as the bit lines.

18. The semiconductor memory device according to claim 12, wherein
the memory chip further includes a semiconductor layer which supports the memory blocks and the dummy blocks, and
the semiconductor layer includes openings which accommodate isolation dielectric layers through which the power coupling contacts pass.

19. The semiconductor memory device according to claim 10, wherein a width of each of the power pads in a direction perpendicular to the extending direction of the bit lines is larger than a width of each of the bit lines.

20. A semiconductor memory device comprising:
a first pad defined on one surface;
an external coupling pad defined on the other surface which faces away from the one surface;
a memory cell array disposed between the one surface and the other surface, and including a memory block and a dummy block;
a bit line disposed in a first wiring layer between the memory cell array and the one surface, and separated into a first bit line section and a second bit line section by being cut over the dummy block, wherein, at a first side of the memory cell array where a circuit chip is bonded, the first bit line section and the second bit line section are coupled to the memory cell array through a plurality of bit line contacts;
a power pad disposed in a space in the first wiring layer, which is provided by the cut bit line, and coupled with the first pad; and
a power coupling contact passing through the dummy block, and coupling the power pad and the external coupling pad.

21. The semiconductor memory device according to claim 20, further comprising:
a coupling line disposed on the dummy block, and extending in a direction parallel to the bit line;
a first contact coupling the first bit line section and one end of the coupling line; and
a second contact coupling the second bit line section and the other end of the coupling line.

* * * * *